(12) United States Patent
Ueki et al.

(10) Patent No.: US 6,650,683 B2
(45) Date of Patent: Nov. 18, 2003

(54) SURFACE EMITTING SEMICONDUCTOR LASER

(75) Inventors: Nobuaki Ueki, Ebina (JP); Akira Sakamoto, Ebina (JP); Masahiro Yoshikawa, Ebina (JP); Hideo Nakayama, Ebina (JP); Hiromi Otoma, Ebina (JP)

(73) Assignee: Fuji Xerox Co, Ltd., Tokyo (JP)

( * ) Notice: Subject to any disclaimer, the term of this patent is extended or adjusted under 35 U.S.C. 154(b) by 0 days.

(21) Appl. No.: 10/228,217

(22) Filed: Aug. 27, 2002

(65) Prior Publication Data

US 2003/0039294 A1 Feb. 27, 2003

Related U.S. Application Data

(63) Continuation-in-part of application No. 09/714,980, filed on Nov. 20, 2000, now Pat. No. 6,529,541.

(30) Foreign Application Priority Data

Aug. 27, 2001 (JP) ......................................... 2001-255915

(51) Int. Cl.$^7$ ............................................... H01S 5/183
(52) U.S. Cl. ........................................... 372/96; 372/46
(58) Field of Search ...................................... 372/96, 46

(56) References Cited

U.S. PATENT DOCUMENTS 5,245,622 A  *  9/1993  Jewell et al. ................. 372/45
5,753,941 A  *  5/1998  Shin et al. ..................... 257/98
5,838,715 A  * 11/1998  Corzine et al. ............... 372/96

* cited by examiner

Primary Examiner—James Davie
(74) Attorney, Agent, or Firm—Oliff & Berridge, PLC

(57) ABSTRACT

The present invention provides a surface emitting semiconductor laser, comprising: a semiconductor substrate having sequentially layered thereon a lower multi-layer mirror, an active layer region, and an upper multi-layer mirror that, together with the lower multi-layer mirror, contributes to the formation of a cavity; an upper electrode disposed on an upper layer of the upper multi-layer mirror and provided with an aperture that forms an emission region of a laser beam generated at the active layer region; and a current confinement portion disposed between the upper electrode and the lower multi-layer mirror and provided with an aperture that forms a current path; wherein an aperture diameter of the upper electrode and an aperture diameter of the current confinement portion are determined such that a difference between an optical loss of the cavity in a higher-order lateral mode of the laser beam and an optical loss of the cavity in a fundamental lateral mode of the laser beam becomes a value in the vicinity of a maximum value, and the higher-order lateral mode is suppressed, and at least one of the aperture formed in the upper electrode and the aperture of the current confinement portion is formed into a two-fold symmetrical configuration having long and short axes with respect to arbitrary two axial directions orthogonal to each other in a plane.

9 Claims, 22 Drawing Sheets

SURFACE EMITTING SEMICONDUCTOR LASER

This application is a Continuation-in-Part (CIP) of U.S. Patent application Ser. No. 09/714,980 filed Nov. 20, 2000, now U.S. Pat. No. 6,529,541 B1.

BACKGROUND OF THE INVENTION

1. Field of the Invention

The present invention relates to a surface emitting semiconductor laser, and more particularly to a surface emitting semiconductor laser with which oscillation of high-output, fundamental lateral mode light is possible.

The present invention further relates to a surface emitting semiconductor laser. More particularly, the present invention relates to a surface emitting semiconductor laser which can oscillate high-output fundamental lateral mode light, and a structure of an element in which polarization of light is controlled and which has high utility value as a light source employed for optical information processing or optical communication or a light source for a xerographic image forming apparatus.

2. Description of Related Art

In comparison with an edge emitting laser, a vertical cavity surface emitting laser (hereinafter referred to as "VCSEL") has numerous merits. For example, manufacturing costs of the VCSEL are low, productivity is high, and achieving a two-dimensional array is easy, coupling efficiency with an optical fiber is high, and electric power consumption is low. For these reasons, the use of the VCSEL for a number of purposes has been investigated in recent years. For example, VCSEL structures, laser characteristics, applications and such VCSEL are described by Kenichi Iga. Fumio Koyama, and Susumu Kinoshita in "Surface emitting Semiconductor Lasers", *IEEE Journal of Quantum Electronics*, 1988, 24, pp. 1845–1855.

However, fundamental lateral made optical output power of conventional VCSELs remains small, or roughly 1 mW at most. Therefore, the application range of conventional VCSELs has been limited to narrow fields, such as a light pick-up used in a CD-ROM drive. With conventional VCSELs, because laser oscillation by the fundamental lateral mode has been obtained by narrowing the diameter of an optical emission region to roughly several μm, the volume of an active region has been resultantly small, and fundamental lateral mode optical output power has been low.

On the other hand, when the fundamental lateral mode optical output power of the VCSEL increases to 5 mW or more, for example, it becomes possible to use the VCSEL for an image writing apparatus like a laser printer, an optical magnetic disk apparatus and the like.

In Japanese Patent Application Laid-Open (JP-A) No. 10-56233, a VCSEL that has a high-intensity fundamental lateral mode optical output power has been proposed. In this proposal, raising an output of the fundamental lateral mode optical output power is realized by selectively suppressing a laser oscillation condition in a higher-order lateral mode that is secondarily generated in addition to the lateral mode. Namely, fundamental lateral mode oscillation in the VCSEL is generated at the center of an optical waveguide (close to an optical axis), and a higher-order lateral mode oscillation is generated at a remote position separate from the optical axis. Consequently, optical loss of a cavity gradually increases as the distance of separation from the optical axis increases, whereby it becomes possible to suppress a shift to a multi-mode oscillation while increasing an injection current value, and the fundamental lateral mode optical output power can be increased.

As shown in FIG. 12, the VCSEL is structured by a conductive semiconductor substrate 171, a lower DBR (Distributed Bragg Refrector) layer 172, an upper DBR layer 174 having a conductive type opposite to that of the lower DBR layer 172, an active layer region 173 interposed between the lower DBR layer 172 and the upper DBR layer 174, a low reflectance zone 175 formed by ion implantation or the like, a loss determination element 176, and electrodes 177 and 178. A laser beam is emitted along an optical axis 179.

The loss determination element 176 is formed in a concave shape, in order to gradually increase the optical loss of the cavity in accordance with an increase in the distance from the optical axis 179 in a direction orthogonal to the optical axis 179. The concave loss determination element 176 has an operation to refract the cavity laser beam and an operation to either disperse the cavity laser beam sideways or deviate the focus. Consequently, together with increasing the distance from the optical axis 179 in a direction orthogonal to the optical axis 179, the loss determination element 176 can increase the refractive loss and enlarge the optical loss of the cavity. Moreover, the fundamental lateral mode oscillation in the VCSEL is generated close to the optical axis 179, and the higher-order lateral mode oscillation is generated at a remote position separate from the optical axis 179.

As a result, with respect to a higher-order lateral mode, optical loss in a cavity (optical cavity) increases, and a threshold current required for laser oscillation in the higher-order lateral mode increases. On the other hand, with respect to a fundamental lateral mode, variation in the optical loss of the cavity is small, and the threshold current does not vary, thus resulting in an increase of maximum optical output power in the fundamental lateral mode.

Japanese National Publication No. 7-507183 (WO 93/22813) discloses a gain-guiding type surface emitting semiconductor laser that, as shown in FIG. 14, forms a metal contact layer 260 having an optical aperture 265 with a diameter smaller than the diameter of an optical gain region 235, and that suppresses higher-order lateral mode oscillation. With this structure, the optical aperture 265 shields a primary-order lateral mode having a high optical intensity nearer the periphery of the optical aperture than of at the center, or a further higher-order lateral mode having an optical intensity peak at the periphery in addition to at the center, from a fundamental lateral mode having a high optical intensity near the center of the optical aperture 265 within a horizontal surface on a substrate 200. Thus, only the fundamental lateral mode optical output power is selectively taken out, whereby the fundamental lateral mode optical output power is increased.

U.S. Pat. No. 5,753,941 discloses a gain-guiding type surface emitting semiconductor laser. As shown in FIG. 15, an auxiliary layer 38 for lowering cavity optical reflectance is formed beneath an electrode layer 40 used for current injection, whereby higher-order mode generated near the electrode layer of an emission aperture 46 is suppressed. In this structure also, the basic principle is selective suppression of oscillation in a primary-order lateral mode or a further higher-order lateral mode. The method by which suppression is carried out is as follows. Depending on the presence or absence of the auxiliary layer 38, a distribution of optical reflectance is formed within a horizontal surface on a substrate 30. A high reflectance is maintained near the center of the optical aperture 46 within the horizontal plane on the substrate, and a reflectance is effectively lowered near the periphery of the optical aperture 46 by the existence of the auxiliary layer 38. Thus, it becomes easier to oscillate in the fundamental lateral mode by providing a difference in the ease of both oscillations.

As described above, according to the technology disclosed in JP-A No. 10-56233, it becomes possible in principle to raise fundamental lateral mode output. However, at the same time, there are also problems in that a negative influence is exerted on fundamental lateral mode characteristics, and it is considerably difficult to stably form the loss determination element 176 of a predetermined configuration.

As Kenichi Iga and Fumio Koyama describe in "Surface emitting Laser" (Ohm, 1990), because it is difficult for the surface emitting semiconductor laser to earn gains necessary for the laser oscillation due to the active region being small, generally a high reflectance is necessary for the cavity. In actuality, VCSEL cavities currently being researched have a reflectance of 99% or higher, when the reflectance of the cavity is low, threshold value current density increases and it becomes difficult for laser oscillation to occur.

In the technology disclosed in JP-A No. 10-56233, the reflectance of the cavity is lowered at a position slightly removed from the optical axis 179. Thus, not only is higher-order lateral mode laser oscillation suppressed, but also laser oscillation of the fundamental lateral mode is suppressed at the same time. As a result, it is surmised that a sufficient high-intensive fundamental lateral mode optical output power will become unobtainable.

Further, the loss determination element 176 is characterized in that it has a curved surface, such as the concave shape shown in FIG. 12, or a convex shape or the like. Therefore, the method by which the configuration of the loss determination element 176 is produced is important. This method is described in detail in JP-A No. 10-56233.

One example will be briefly explained below. As shown in FIG. 13A, a photoresist 182 is coated on a surface of a layer 181 on which a curved surface is to be formed. Next, as shown in FIG. 13B, a cylindrical photoresist pillar 183 is formed using normal exposure, development and bake processings. The photoresist pillar 183 is heated at a temperature of roughly 250° C. to 300° C. for about five to twenty minutes. Then, as shown in FIG. 13C, the photoresist pillar 183 changes into a layer 184 having convex surface. The temperature of the layer 184 returns to room temperature, and the convex shape of the curved surface is stably maintained thereafter.

Next, a dry etching is administered to this surface using a reactive ion etching (RIE) from the top. The layer 184 works as an etching mask and reflects this shape. As a result, a structure 185 having a curved surface with a convex configuration is formed, as shown in FIG. 13D.

A method of forming a structure having a curved surface with a convex configuration has been described above. However, when the photoresist pillar 183 is provided at the periphery of the layer 181 instead of at the center of the layer 181, it is possible to form a structure having a concave surface with a concave configuration at the center of the layer 181.

The shape of the layer 184 that operates as an etching mask is required to have a predetermined curved surface at a predetermined position. However, even based on present etching technologies, it is substantially difficult to form with good reproducibility and without positional dependency a curved surface at always the same position. This problem becomes particularly pronounced when a large number of VCSEL elements is provided to form a two-dimensional array.

Moreover, it is extremely difficult to finish the etching at a proper position either at the point the layer 184 working as the etching mask in the RIE process disappears or thereafter, in order to form the loss determination element 176 having a predetermined, curved-surface configuration and a predetermined film thickness.

In addition, when a large number of VCSEL elements is provided to form a two-dimensional array, it is extremely difficult to control with high precision an etching selection ratio between materials that structure the photoresist pillar 183 and the loss determination element 176 on the same substrate or on different substrates. Therefore, it is extremely difficult to match reflectance characteristics of the loss determination element 176 between each of the VCSEL elements.

As described above, it is extremely difficult to eliminate or minimize variations in the shape and film thickness of the loss determination elements 176 between VCSEL elements on the same substrate, between VCSEL elements on different substrates, or between VCSEL elements in which lots in processes are different.

On the other hand, the optical loss of the cavity is gradually increased as the cavity is positioned farther from the optical axis 179 by utilizing the concave shape of the curved surface of the loss determination element 176. Accordingly, the injection current value is increased, the higher-order lateral mode shift to laser oscillation is suppressed, and fundamental lateral mode laser oscillation is made possible. Therefore, when the shape of the concave surface of the loss determination element 176 is different, the higher-order lateral mode optical output power value of the VCSEL that shifts to the laser oscillation is different, i.e., a fundamental lateral mode maximum optical output power value, is different. As a result, fundamental lateral mode maximum optical output power values of the VCSEL elements are different between VCSEL elements on the same substrate, between VCSEL elements on different substrates, or between VCSEL elements in which lots in processes are different. Therefore, it is difficult to industrially utilize for purposes in which a high-intensity fundamental lateral mode optical output power is required the technology disclosed in JP-A No. 10-56233.

With regard to the characteristics of a structure of a surface emitting semiconductor laser, Japanese National Publication No. 7-507183 (WO 93/22813) discloses "the metal layer has an optical aperture aligned in a direction vertical to a gain region, and this optical aperture has a diameter equal to or smaller than the diameter of the gain area".

Here, the reason that the optical aperture has a diameter equal to or smaller than the diameter of the gain area in order to sufficiently suppress higher-order lateral mode oscillation is that the diameter of the optical aperture is, is not irrelevant to the fact that the structure of the elements indicated in the embodiments uses a technology to raise the resistance of a semiconductor layer by a proton injection.

In a surface emitting semiconductor laser of a proton injection system, the conductivity of a region subjected to proton injection is lowered in comparison with the conductivity of a region that has not been subjected to proton injection. Accordingly, a current contracted structure is formed, and a carrier injected from upper and lower electrodes intensively passes through a specific portion (the region that has not been subjected to proton injection) within the planar surface of an active region. Consequently. recombination of electrons with positive holes occurs at this region, photons are generated, and the photons propagate within the cavity to result in laser oscillation. A laser having such a structure is generally called a gain-guiding laser. That is, a gain-guiding laser denotes a structure in which a region (an optical gain region) where the recombination of electrons with positive holes occurs actively is limited by proton injection to result in laser oscillation.

The proton injection technique has conventionally been utilized in semiconductor processes, and may be regarded as an established process. The proton injection technique has also been utilized in the manufacturing process of surface emitting semiconductor lasers since their initial period. However, because of the nature of the technique, in that a large amount of impure ions that become foreign materials to the semiconductor material to be processed is implanted, it is difficult to accurately demarcate the interface between the implanted region and other regions, and removing indistinct regions is unavoidable. Therefore, often the diameter of the non-injected region is, albeit narrow, 10 μm and typically around 20 μm.

At the time the diameter of the optical gain region that has been defined by the current confining structure is 10 to 20 μm in the gain-guiding type surface emitting semiconductor laser, when the current density is raised by increasing the amount of carriers injected to obtain a large optical output power, ununiformity in the distribution of the carrier generally occurs so that the lateral mode easily becomes unstable. Further, near the center of the optical gain region in which the recombination of carriers occurs most actively, carrier consumption amount becomes larger than that in surrounding regions, whereby a so-called hole-burning phenomenon, in which there is a shortage of positive holes, occurs. Accordingly, a state in which the lateral mode breaks up and oscillation in the lateral mode becomes difficult is triggered.

In Japanese National Publication No. 7-507183, which was devised to avoid this problem, it is essential that the diameter of the optical aperture that meets the object of selectively taking out only the fundamental lateral mode optical output power by shielding the higher-order lateral mode with the optical aperture is "a diameter equal to or smaller than the diameter of the gain area". The embodiments disclose "typically, the diameter of the optical aperture 265 is from 2 μm to 7 μm, and the diameter of the optical gain region 235 is from 10 μm to 30 μm". The range of these numerical values is consistent with the above description.

The above method has achieved certain results regarding an increase in the fundamental lateral mode optical output power. However, speaking in relation to the gain-guiding type surface emitting semiconductor laser, there have been the following substantial problems. Electrical power consumption of the gain-guiding surface emitting semiconductor laser is about the same as or slightly lower than that of the edge emitting laser. Emission efficiency is about 20%, which is not too high. Further, though detailed explanation cannot be given here, for reasons of principle, the optical response property is extremely slow (msec order) unless a certain bias voltage is applied. Therefore, recently, the gain-guiding surface emitting semiconductor laser is being superseded by a surface emitting semiconductor laser of a selective oxidization system to be described later.

On the other hand, U.S. Pat. No. 5,753,941 discloses a surface emitting semiconductor laser provided with "an electrode layer 40 formed on the second reflector layer 36 and constituting a cavity for emitting light transmitted through the second reflector layer 36, wherein the electrode layer 40 comprises a metal layer 44 having a high electrical conductivity and connected to an external power source, and a conductive auxiliary reflector layer 42 formed under said metal layer, and having a reflectivity which is lower than those of the first reflector layer 32 and the second reflector layer 36".

Here, reasons why the electrode layer 40 has a two layer structure comprising the metal layer 44 and the auxiliary reflection layer 42, and has a reflectivity which is lower than those of the first reflector layer 32 and the second reflector layer 36 are as follows. When the electrode layer 40 has a structure comprising only the metal layer 44 without the auxiliary reflection layer 42, a reflection beam from the electrode layer 40 returns in the direction of the second reflector layer 36, thereby impacting conditions for fundamental lateral mode oscillation and emission intensity. Further, when the electrode layer 40 has a structure in which the auxiliary reflection layer 42 has been introduced, the auxiliary reflection layer 42, having a low reflectivity and present at a position nearer the higher-order mode having a higher optical intensity at the periphery rather than at the center of the emission aperture 46, works in a direction to suppress higher-order mode oscillation.

The principle of causing a distribution of reflectivity near the aperture 46, from which a laser beam is emitted, and influencing lateral mode properties by providing the auxiliary reflection layer 42 having a relatively low reflectance can be understood intuitively. However, in considering that the order of a lateral mode whose existence inside the aperture is permitted by the diameter of the optical gain region or by the distribution of the injected carrier changes, it becomes necessary to specify the portion whose reflectivity is to be lowered, in order to suppress higher-order mode oscillation by influencing the change. In other words, it is insufficient to provide no numerical disclosures regarding what settings are effective for the length of the protruding portion 43 or the distance thereof from the aperture center. Without an indication of preferable ranges of condition, questions linger as to whether the fundamental lateral mode can actually be obtained.

Further, the VCSELs described in Japanese National Publication No.7-507183 and U.S. Pat. No. 5,753,941 are both gain-guiding type VCSELs. Even in the embodiments therein, concrete descriptions are provided that mainly use proton injection type surface emitting semiconductor lasers as examples. Therefore, higher-order mode suppression assuming a refractive index guiding type surface emitting semiconductor laser that uses the selective oxidization technique and that is now emerging as the mainstream of surface emitting semiconductor lasers has not been taken into consideration. Thus, it can be predicted that, even adapting these means as they are to the surface emitting semiconductor laser of the selective oxidization technique, effects cannot be adequately demonstrated.

In the application of laser, use of circular light-emitting spots is often desired. In this respect, the surface emitting semiconductor laser can form a circular spot since it does not require any extreme aspect ratio in a light-emitting region. Further, since two-dimensional integration in the same wafer and inspection of elements at a wafer level are enabled, the surface emitting semiconductor laser can provide a laser element which has extremely high density and which can be manufactured inexpensively as compared to known semiconductor lasers. As a result, demand for surface emitting semiconductor lasers in the field of communication is increasing.

Ordinarily surface emitting semiconductor lasers except surface emitting semiconductor lasers with a strained quantum well active layer do not have anisotropy of gain in planes perpendicular to the light-emitting directions, and have a probability of homogeneously polarizing in all directions.

When polarization characteristics (directions of polarized wave planes) are different for each element, if the surface emitting semiconductor lasers are used together with optical elements having polarized waves-dependency, such as mirrors or polarized light beam splitters to which no specified coatings have been applied, optical characteristics (here, optical output powers) of light beams which have passed through these optical elements vary. For this reason, in engineering developments of the surface emitting semiconductor lasers, various improvements for stabilizing polarization of laser elements in one fixed direction have conventionally been attempted.

Japanese Patent Application Laid-Open (JP-A) No. 6-302911 discloses a surface emitting semiconductor laser in which a laser gain region is appropriately formed, and more specifically, a cross section of the gain region is configured so as to have an aspect ratio of more than 1.2, whereby devices are polarized in a longer dimension in the fundamental mode. The active region of this surface emitting semiconductor laser is formed in a specific shape (e.g. an irregular rhomboid, dumbbell, or cross shape) in which a primary dimension of two cross sections orthogonal to each other is larger than a sub dimension by a coefficient of 1.2 or more. Light emitted from the active region formed in such a shape is preferably provided with a low order mode, and is polarized (instead of "polarization", a term "deflection" is used in this specification by mistake) in a direction of a primary dimension AC.

This disclosure might be a simple polarization controlling method because this cross-sectional configuration can be formed by forming a cavity into a specified configuration by dry-etching in a refractive index guide laser or by forming a shaped-ion implantation region around a gain-guiding laser.

However, no description of basic principle has been made in the specification of the JPA-No. 6-302911 as to why polarization directions can be controlled and at the same time, an oscillation in the fundamental mode is selected when "the cross-section of the gain region is configured so as to have the aspect ratio of more than 1.2". Besides, a method in which this has been verified is not based on direct evaluation of the polarization characteristics, thus making it difficult to objectively judge the effects of this disclosure.

In IEEE Photonics Technology Letters (Volume No. 10, pp. 633 (1998)), a description is made of indium gallium arsenide (InGaAs)-selective oxidation type surface emitting laser using an off-angled substrate in which a gallium arsenide (GaAs) (311) B-surface is used as a normal direction. The diameter of an optical guided wave (active) region that is formed by a selective oxidation is a rectangle of 6 μm×3 μm. A long axial direction of the rectangle corresponds to [−233] direction and a polarization direction thereof also corresponds to [−233] direction. This surface emitting semiconductor laser could obtain polarization characteristics in which orthogonal polarization suppression ratio is equal to or greater than 30 dB by using the off-angled substrate having a specific surface orientation which is referred to as (311) B together with a strained quantum well active layer.

This method seems to be very effective means for controlling polarization. However, since the GaAs off-angled substrate whose (311) B-surface is the normal direction is formed according to special specifications, a manufacturing cost of the GaAs off-angled substrate is higher than that of the GaAs substrate which is most frequently used and whose (100) surface is the normal direction. Further, when a crystal growth is conducted on this off-angled substrate, it is presumed that various conditions such as temperature, gas flow, and the like are different greatly from those of a crystal growth conducted on (100) surface which crystal growth is widely conducted, thus requiring an extraordinary cost and time until crystal growth conditions that can exhibit high reproducibility are found and put into practical use.

SUMMARY OF THE INVENTION

An object of the present invention is to provide a refractive index waveguide type surface emitting semiconductor laser that can be manufactured easily and that is capable of oscillating fundamental lateral mode light having a high output.

Another object of the present invention is to provide a surface emitting semiconductor laser which can control polarization of a laser beam in a fixed direction with a relatively simple structure and which has excellent electric and optical characteristics such as low threshold current and high output.

As a result of their extensive investigation, the inventors of the present invention have found that, in accordance with the following means, a high-output surface emitting semiconductor laser in which higher-order lateral mode oscillation is suppressed without exerting a negative effect on fundamental lateral mode oscillation is obtainable.

A first aspect of the present invention is a surface emitting semiconductor laser comprising: a semiconductor substrate having sequentially layered thereon a lower multi-layer mirror, an active layer region, and an upper multi-layer mirror that, together with the lower multi-layer mirror, contributes to the formation of a cavity; an upper electrode disposed on an upper layer of the upper multi-layer mirror and provided with an aperture that forms an emission region of a laser beam generated at the active layer region; and a current confinement portion disposed between the upper electrode and the lower multi-layer mirror and provided with an aperture that forms a current path; wherein, on the basis of a reflectance of a region of the cavity corresponding to the upper electrode, an aperture diameter of the upper electrode and an aperture diameter (an oxide aperture diameter) of the current confinement portion are determined such that a difference between an optical loss of the cavity in a higher-order lateral mode of the laser beam and an optical loss of the cavity in a fundamental lateral mode of the laser beam becomes a value in the vicinity of a maximum value and such that the higher-order lateral mode is suppressed.

Ordinarily, optical loss of a cavity in the higher-order lateral mode of a laser beam becomes larger than optical loss of the cavity in the fundamental lateral mode of a laser beam. Difference in optical loss of the cavity here means the difference when the optical loss of the cavity in the fundamental lateral mode of a laser beam is subtracted from the optical loss of the cavity in the higher-order lateral mode of a laser beam. The larger the difference in optical loss of the cavity is, the more preferable. Determining the aperture diameter of the upper electrode and the aperture diameter of the current confinement portion so that the difference in optical loss becomes a value in the vicinity of a maximum value is more preferable.

Further, the reflectance of the cavity of the region corresponding to the upper electrode is a reflectance of a cavity structured to include the region in which the upper electrode is provided directly on the upper multi-layer mirror. The reflectance of the cavity of the region corresponding to the emission region is a reflectance of a cavity structured to include the region that becomes the emission region of the upper multi-layer mirror.

In the surface emitting semiconductor laser relating to the first aspect, it is possible to enlarge a rate at which the aperture diameter of the upper electrode is increased as the reflectance of the cavity of the region corresponding to the upper electrode is lowered. Further, it is possible to make the aperture diameter of the upper electrode equal to or larger than the aperture diameter of the current confinement portion. Yet further, it is possible to ensure that the reflectance of the cavity of the region corresponding to the upper electrode becomes lower than the reflectance of the cavity of the region corresponding to the emission region.

A second aspect of the present invention is a surface emitting semiconductor laser comprising: a semiconductor substrate having sequentially layered thereon a lower multi-layer mirror, an active layer region, and an upper multi-layer mirror that, together with the lower multi-layer mirror, contributes to the formation of a cavity; an upper electrode disposed on an upper layer of the upper multi-layer mirror and provided with an aperture that forms an emission region of a laser beam generated at the active layer region; and a current confinement portion disposed between the upper electrode and the lower multi-layer mirror and provided with an aperture that forms a current path; wherein, on the basis of a reflectance of a region of the cavity corresponding to the emission region and a reflectance of the cavity of a region corresponding to the upper electrode, an aperture diameter of the upper electrode and an aperture diameter of the current confinement portion are determined such that a difference between an optical loss of the cavity in a higher-order lateral mode of the laser beam and an optical loss of the cavity in a fundamental lateral mode of the laser beam becomes a value in the vicinity of a maximum value and such that the higher-order lateral mode is suppressed.

In the surface emitting semiconductor laser relating to the second aspect, it is possible to enlarge a rate at which the aperture diameter of the upper electrode it increased as the reflectance of the cavity in the region corresponding to the upper electrode is lowered. Further, it is possible to make the aperture diameter of the upper electrode equal to or larger than the aperture diameter of the current confinement portion. Yet further, it is possible to ensure that the reflectance of the cavity of the region corresponding to the upper electrode becomes lower than the reflectance of the cavity corresponding to the emission region. Still yet further, it is possible to increase the aperture diameter of the upper electrode as the reflectance of the cavity of the region corresponding to the emission region is lowered, and to reduce the aperture diameter of the upper electrode when the reflectance of the cavity of the region corresponding to the emission region is made higher.

A third aspect of the present invention is a surface emitting semiconductor laser comprising: a semiconductor substrate having sequentially layered thereon a lower multi-layer mirror, an active layer region, and an upper multi-layer mirror that, together with the lower multi-layer mirror, contributes to the formation of a cavity; an upper electrode disposed on an upper layer of the upper multi-layer mirror and provided with an aperture that forms an emission region of a laser beam generated at the active layer region; and a current confinement portion disposed between the upper electrode and the lower multi-layer mirror and provided with an aperture that forms a current path; wherein, an aperture diameter of the upper electrode and an aperture diameter of the current confinement portion are determined such that a difference between an optical loss of the cavity in a higher-order lateral mode of the laser beam and an optical loss of the cavity in a fundamental lateral mode of the laser beam becomes a value in the vicinity of a maximum value and such that the higher-order lateral mode is suppressed.

In the surface emitting semiconductor laser relating to the third aspect, it is possible for the aperture diameter of the upper electrode to be determined at a value that suppresses a higher-order lateral mode, and for the aperture diameter of the current confinement portion to be determined at a value that permits a higher-order lateral mode of a third order or lower. Further, when the aperture diameter of the upper electrode is to be made larger than the aperture diameter of the current confinement portion, the aperture diameter of the upper electrode can be made larger within a range of about 2 $\mu$m or lower, and when the aperture diameter of the upper electrode is to be made smaller than the aperture diameter of the current confinement portion, the aperture diameter of the upper electrode can be made smaller within a range of about 1 $\mu$m or lower, still further, the aperture diameter of the current confinement portion is preferably about 3 $\mu$m to about 5 $\mu$m.

It is possible to ensure that optical loss of the cavity in the higher-order lateral mode of a laser beam becomes larger than the optical loss of the cavity in a basic lateral mode of a laser beam, and to ensure that the reflectance of the cavity of the region corresponding to the upper electrode becomes lower than a reflectance of the cavity of the region corresponding to the emission region. The reflectance of the cavity of the region corresponding to the upper electrode is preferably 95% or lower, and more preferably 80% or lower.

Methods for lowering the reflectance of the cavity by providing the upper electrode include the methods described below. According to these methods, the reflectance of the cavity of the region corresponding to the upper electrode can be lowered without providing a reflectance lowering structure having a special shape. As a result, manufacturing is easy.

(1) A method in which the upper electrode is formed by layering two or more kinds of metal materials.

(2) A method in which the upper electrode is formed by forming a thin film made of a metal material, heat treating the thin film in a temperature range of 250° C. to 400° C., and advancing an alloying between the thin film and a layer adjacent to the thin film.

It is preferable to select metal materials for structuring the upper electrode from Au, Pt, Ti, Zn, Ni, In, W, Cu, Al, Au—Sn alloy, Au—Zn alloy, Au—Ge alloy, and indium tin oxide (ITO). The thin film made of a metal material may be formed by metal deposition.

It is preferable that the heat treatment is carried out at a temperature within a temperature range of 300° C. to 350° C. The heat treatment method is preferable administered in accordance with any one of methods selected from flash lamp annealing by infrared rays, laser annealing, microwave heating, electron beam annealing, and lamp heating.

The current confinement portion may be formed by insulating a periphery of a current path through oxidization and air gap by etching.

Further, according to a further aspect of the present invention, there may be provided a surface emitting semiconductor laser comprising: a semiconductor substrate having a lower multi-layer mirror, an active layer region and an upper multi-layer mirror sequentially formed on an upper portion, and having a lower electrode provided on a lower portion; an upper electrode as an upper layer of the upper multi-layer mirror, provided to surround an emission aperture around the periphery of an emission center of a laser beam generated in the active layer region, and forming a pair with the lower electrode and made of a metal material for injecting a current into the active layer region; and a current confinement portion provided between the upper electrode and the lower electrode, and formed to insulate a peripheral edge portion of a current path, wherein the reflectance of a multi-layer mirror at the periphery of the emission center on which the upper electrode has been provided is made lower than the reflectance of a multi-layer mirror at the emission center, and the diameter of the emission aperture is made larger than the diameter of the current confinement portion according to a level of reduction in the reflectance of the multi-layer mirror at the periphery of the emission center.

A surface emitting semiconductor laser according to a fourth aspect of the present invention, comprises: a semiconductor substrate having sequentially layered thereon a lower multi-layer mirror, an active layer region, and an upper multi-layer mirror that, together with the lower multi-layer mirror, contributes to the formation of a cavity; an upper electrode disposed on an upper layer of the upper multi-layer mirror and provided with an aperture that forms an emission region of a laser beam generated at the active layer region; and a current confinement portion disposed between the upper electrode and the lower multi-layer mirror and provided with an aperture that formed a current path, wherein an aperture diameter of the upper electrode and an aperture diameter of the current confinement portion are determined such that a difference between an optical loss of the cavity in a higher-order lateral mode of the laser beam and an optical loss of the cavity in a fundamental lateral mode of the laser beam becomes a value in the vicinity of a maximum value, and the higher-order lateral mode is suppressed, and at least one of the aperture formed in the upper electrode and the aperture of the current confinement portion is formed into a two-fold symmetrical configuration having long and short axes with respect to arbitrary two axial directions orthogonal to each other in a plane.

In the surface emitting semiconductor laser according to the fourth aspect of the present invention, the other of the aperture formed in the upper electrode and the aperture of the current confinement portion is preferably isotropic to arbitrary two axial directions orthogonal to each other in the plane. Further, the isotropic configuration is preferably one of a circle, a square, and a regular polygon.

The surface emitting semiconductor laser according to the fourth aspect of the present invention is characterized by that one configuration of the aperture formed in the upper electrode and the aperture of the current confinement portion is formed into a symmetrical configuration, and the other configuration is a two-fold symmetrical geometric configuration having long and short axes with respect to arbitrary two axial directions which are orthogonal to each other in the plane of the substrate. The surface emitting laser having this structure has characteristics of arranging a plane of polarization of a laser beam in the direction of the long axis thereof, thus making it possible to control the plane of polarization of the laser beam in a fixed direction.

In the surface emitting semiconductor laser according to the fourth aspect of the present invention, if the crystal orientation of the semiconductor substrate is (100) surface, it is preferable that the arbitrary two axial directions is a combination of [01-1] direction and [011] direction or a combination of directions which are crystallographically isotropic to the combination of [01-1] direction and [011] direction.

Further, it is preferable that the two-fold symmetrical configuration having the long and short axes is formed in a flat oval, ellipse, rectangular, or rhomboidal shape.

The principle of the fundamental lateral mode optical output power according to the present invention will be explained below. In a surface emitting semiconductor laser shown in FIG. 1, an aperture diameter of an aperture of a current confinement portion 24 is defined as an aperture diameter ($W_{oxide}$) of the current confinement portion, and a diameter of an electrode aperture 27 is defined as an metal (electrode) aperture diameter ($W_{metal}$). Then, the aperture diameter of the current confinement portion and the metal aperture diameter are changed variously, and a difference between a round-trip loss of a cavity in a fundamental lateral mode and a normalized round-trip loss is calculated. The surface emitting semiconductor laser shown in FIG. 1 has the same structure as the structure (shown in FIG. 5G) of a surface emitting semiconductor laser in a first embodiment to be described later, except the reflectance of a multi-layer mirror, the aperture diameter of a current confinement portion, and the value of an metal aperture diameter are different respectively. A pair of DBR layers constitute a cavity. In FIG. 1, parts that are identical to those of the surface emitting semiconductor laser shown in FIG. 5G are attached with like reference symbols, and their explanation will be omitted.

In FIG. 2, the round trip loss of a cavity in a fundamental lateral mode (zero-order mode) is expressed as a function of the metal aperture diameter when the aperture diameter of the current confinement portion is constant at 3.5 $\mu$m. Based on the assumption that a reflectance ($R_{cavity}$) of the cavity of the region corresponding to the emission region is 99.4%, a reflectance ($R_{metal}$) of the cavity of the region corresponding to the upper electrode is changed from 75% to 99%. Further, the value of the metal aperture diameter for each reflectance ($R_{metal}$) is changed from 1.5 to 6.0 $\mu$m. The increase in the round trip loss works in a direction to make it difficult to generate an oscillation. As can be understood from the graph, when only the round trip loss of the cavity in the fundamental lateral mode is looked at, the reduction of the reflectance of the cavity of the region corresponding to the upper electrode increases the loss in the fundamental lateral mode. Therefore, in terms of fundamental lateral mode oscillation, it is preferable that the reflectance of the cavity of the region corresponding to the upper electrode is high and that the metal aperture diameter is large.

Here, behavior in the higher-order mode becomes a problem. When the electrode aperture is made larger, this works in a direction to facilitate the oscillation in a higher-order mode where the optical intensity is higher at the periphery of the emission aperture that at the center of the emission aperture. Therefore, it is necessary to investigate which one of the influence to the fundamental lateral mode and the influence to the higher-order mode becomes larger when the metal aperture diameter is made larger.

FIG. 3 shows how a value obtained by dividing a difference between the round trip loss of the cavity in the primary-order lateral mode and the round trip loss of the cavity in the fundamental lateral mode by the round trip loss of the cavity in the fundamental lateral mode (hereinafter to be referred to as a "normalized round trip loss difference") changes based on the metal aperture diameter, when the reflectance of the cavity of the region corresponding to the upper electrode, with the electrode formed above, is changed from 75% to 99%. This normalized round trip loss difference is obtained under the assumption that the aperture diameter of the current confinement portion is constant at 3.5 µm, and that the reflectance of the cavity of the region corresponding to the emission region is 99.4%. In this case, the increase in the normalized round trip loss difference means that the ratio of the increase in the round trip loss in the primary-order lateral mode is larger than the ratio of the increase in the roundtrip loss in the fundamental lateral mode. In this case, the oscillation in the primary-order lateral mode is relatively hard to occur, and as a result, the oscillation in the fundamental lateral mode becomes more advantageous than in the primary-order lateral mode. It is possible to expand the concept of this primary-order lateral mode to a higher-order lateral mode, and the increase in the normalized round trip loss difference also means that the oscillation in the fundamental lateral mode is more advantageous than in the higher-order lateral mode.

In actuality, the laser oscillation between in the fundamental lateral mode and in the higher-order lateral mode is not selected based on only the relative ratio of the round trip loss. Therefore, both the fundamental lateral mode and the higher-order lateral mode exist together. However, as shown in FIG. 3, the normalized round trip loss difference in each reflectance ($R_{metal}$) has a peak value in a predetermined metal aperture diameter. When an metal aperture diameter near the metal aperture diameter corresponding to this peak value is utilized, the oscillation in the fundamental lateral mode becomes more advantageous than in the higher-order lateral mode. In other words, it can be understood that the higher-order lateral mode is suppressed.

From FIG. 3, it can also be understood that the metal aperture diameter that shows a peak and the steepness of the peak change according to the reflectance of the cavity of the region corresponding to the upper electrode. For example, when the reflectance of the cavity of the region corresponding to the upper electrode is 95%, the normalized round trip loss difference becomes a maximum at the time the metal aperture diameter is 3.3 µm. In other words, 3.3 µm is an optimum metal aperture diameter. When the reflectance of the cavity of the region corresponding to the upper electrode is 90%, the normalized round trip loss difference becomes a maximum when the metal aperture diameter is 4.0 µm. When the reflectance of the cavity of the region corresponding to the upper electrode is 85%, the normalized round trip loss difference becomes a maximum when the metal aperture diameter is 4.2 µm. When the reflectance of the cavity of the region corresponding to the upper electrode is 80%, the normalized round trip loss difference becomes a maximum when the metal aperture diameter is 4.6 µm. When the reflectance of the cavity of the region corresponding to the upper electrode is 75%, the normalized round trip loss difference becomes a maximum when the metal aperture diameter is 4.8 µm. Therefore, it is preferable that the metal aperture diameter is within the range from 3.3 µm to 4.8 µm when the reflectance of the cavity of the region corresponding to the upper electrode is within the range from 75% to 95%.

When the reflectance of the cavity of the region corresponding to the upper electrode is 95%, the steepness of the peak of the normalized round trip loss difference becomes high. As the reflectance of the cavity of the region corresponding to the upper electrode becomes lower toward 90%, 85%, 60% and 75%, the peak becomes steeper, and the normalized round trip lose difference increases. In other words, when the reflectance of the cavity of the region corresponding to the upper electrode is lowered to 90%, 85%, 80% and 75% respectively, the oscillation in the fundamental lateral mode becomes more advantageous than in the higher-order lateral mode. When the reflectance of the cavity of the region corresponding to the upper electrode becomes lower than 75%, both the higher-order lateral mode and the fundamental lateral mode are suppressed, and the optical output power decreases as a result.

Table 1 shows optimum values of $W_{metal}$ predicted from the above result when each value of $R_{cavity}$, $R_{metal}$ and $W_{oxide}$ has been determined. In example 5 to example 7, each value of $R_{cavity}$, $R_{metal}$, $W_{oxide}$ and $W_{metal}$ is an actually measured value.

TABLE 1

|  | $R_{cavity}$ | $R_{metal}$ | $W_{oxide}$ | Optimal value of $W_{metal}$ |
|---|---|---|---|---|
| Example 1 | 0.994 | 0.75 | 3.5 µm | 4.8 µm |
| Example 2 | 0.994 | 0.95 | 3.5 µm | 3.3 µm |
| Example 3 | 0.997 | 0.90 | 3.5 µm | 4.2 µm |
| Example 4 | 0.990 | 0.90 | 3.5 µm | 3.8 µm |
| Example 5 | 0.994 | 0.90 | 3.0 µm | 4.0 µm |
| Example 6 | 0.994 | 0.90 | 3.5 µm | 4.0 µm |
| Example 7 | 0.994 | 0.90 | 5.0 µm | 5.0 µm |
| Example 8 | 0.997 | 0.75 | 3.0 µm | 5.0 µm |
| Example 9 | 0.997 | 0.75 | 3.5 µm | 5.0 µm |
| Example 10 | 0.997 | 0.75 | 5.0 µm | 6.0 µm |
| Example 11 | 0.990 | 0.95 | 3.0 µm | 3.1 µm |
| Example 12 | 0.990 | 0.95 | 3.5 µm | 3.1 µm |
| Example 13 | 0.990 | 0.95 | 5.0 µm | 4.1 µm |

FIG. 7 shows preferable ranges of $W_{metal}$ from the above result. As shown in FIG. 7, when the reflectance ($R_{cavity}$) of the cavity of the region corresponding to the emission region is within the range from 99.0% to 99.7% and also when the reflectance ($R_{metal}$) of the cavity of the region corresponding to the upper electrode is within the range from 75% to 95%, it is preferable that the metal aperture diameter ($W_{metal}$) is within the range from 3.0 µm to 5.0 µm for the aperture diameter ($W_{oxide}$) of the current confinement portion at 3.0 µm. Further, it is preferable that the metal aperture diameter ($W_{metal}$) is within the range from 3.2 µm to 5.2 µm for the aperture diameter ($W_{oxide}$) of the current confinement portion at 3.5 µm. It is preferable that the metal aperture diameter ($W_{metal}$) is within the range from 3.5 µm to 5.5 µm for the aperture diameter ($W_{oxide}$) of the current confinement portion at 4.0 µm. It is preferable that the metal aperture diameter ($W_{metal}$) is within the range from 4.0 µm to 6.0 µm for the aperture diameter ($W_{oxide}$) of the current confinement portion at 4.5 µm.

Further, in the metal aperture diameter near the optimum metal aperture diameter, the normalized round trip loss difference is not largely different from that when the metal aperture diameter takes the optimum value. Therefore, there is a predetermined permissible range of metal aperture diameter. In the following cases, it is possible to obtain an effect approximately similar to that when the metal aperture diameter is taken. When the metal aperture diameter is made larger than the aperture diameter of the current confinement portion, the metal aperture diameter is increased to a range of the aperture diameter of the current confinement portion plus 0 to 2 µm. When the metal aperture diameter is made smaller than the aperture diameter of the current confinement portion, the metal aperture diameter is decreased to a range of the aperture diameter of the current confinement portion minus 0 to 1 µm.

FIG. 4 shows how a normalized round trip loss difference changes when the reflectance of the cavity of the region corresponding to the mission region is changed to 99.0%, 99.4%, and 99.7%, by assuming that the aperture diameter of the current confinement portion is constant at 3.5 µm, and the reflectance of the cavity of the region corresponding to the upper electrode, having an electrode formed in the above, is 90%. As shown in FIG. 4, it can be understood that when the reflectance of the cavity of the region corresponding to the emission region becomes high, the metal aperture diameter at which the normalized round trip loss difference shows a peak value becomes slightly large. It is preferable that the metal aperture diameter is within a range from 3.8 µm to 4.2 µm when the reflectance of the cavity of the region corresponding to the emission region is within the range from 99.0% to 99.7%. Further, when the reflectance of the cavity of the region corresponding to the emission region becomes higher, the oscillation in the fundamental lateral mode becomes more advantageous than in the higher-order lateral mode. A variation curve is indicated in FIG. 3 by a broken line for a case in which the reflectance of the cavity of the region corresponding to the upper electrode is 90% and the reflectance of the cavity of the region corresponding to the emission region is 99.0%, and a case in which the reflectance of the cavity of the region corresponding to the upper electrode is 90% and the reflectance of the cavity of the region corresponding to the emission region is 99.7%.

FIG. 3 shows by broken lines the curves of changes in a difference between normalized round trip losses in the case in which the reflectance of the cavity in a region corresponding to the upper electrode is 90% and the reflectance of the cavity in a region corresponding to the light-emitting region is 99.9%, and in the case in which the reflectance of the cavity in a region corresponding to the upper electrode is 90% and the reflectance of the cavity in a region corresponding to the light-emitting region is 99.7%.

Therefore, it is possible to efficiently obtain the fundamental lateral mode oscillation by optimizing the metal aperture diameter for the aperture diameter of the current confinement portion according to the reflectance of the cavity of the region corresponding to the upper electrode and the reflectance of the cavity of the region corresponding to the emission region. While it is not possible to extract an optical beam when the reflectance of the cavity of the region corresponding to the emission region is 100%, it is difficult to obtain the laser oscillation when the reflectance of the cavity at the center of the emission aperture is 95% or below. As the reflectance of the cavity at the center of the emission aperture is usually 99% or above, it is substantially possible to efficiently obtain the fundamental lateral mode oscillation by optimizing the metal aperture diameter for the aperture diameter of the current confinement portion according to the reflectance of the cavity of the region corresponding to the emission region.

As explained above, according to the surface emitting semiconductor laser of the present invention, it is possible to increase the fundamental lateral mode output by selectively suppressing a laser oscillation condition in a higher-order lateral mode that is secondarily generated, without losing the characteristics of the fundamental lateral mode oscillation.

DETAILED DESCRIPTION OF THE PREFERRED EMBODIMENTS

Embodiments of the present invention will hereinafter be explained in detail with reference to Figures.
First Embodiment A structure of a VCSEL relating to a first embodiment of the present invention will be explained with reference to FIGS. 5A to 5G that illustrate a manufacturing process of the VCSEL.

Figure 1:
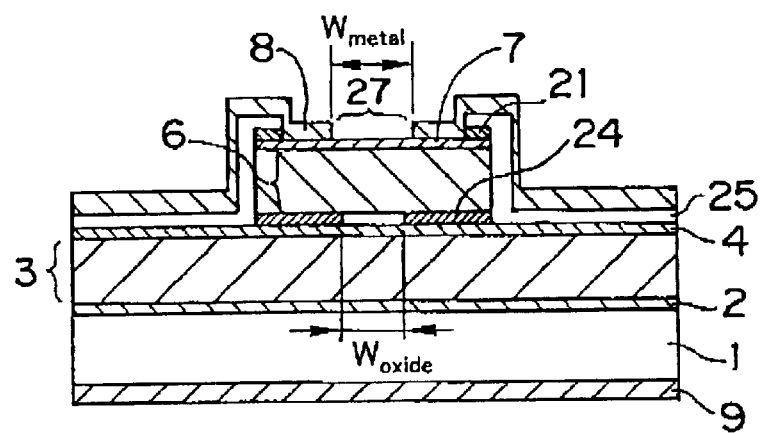
FIG. 1 is schematic cross-sectional view of a surface emitting semiconductor laser for describing a principle of the present invention.
Figure 2:
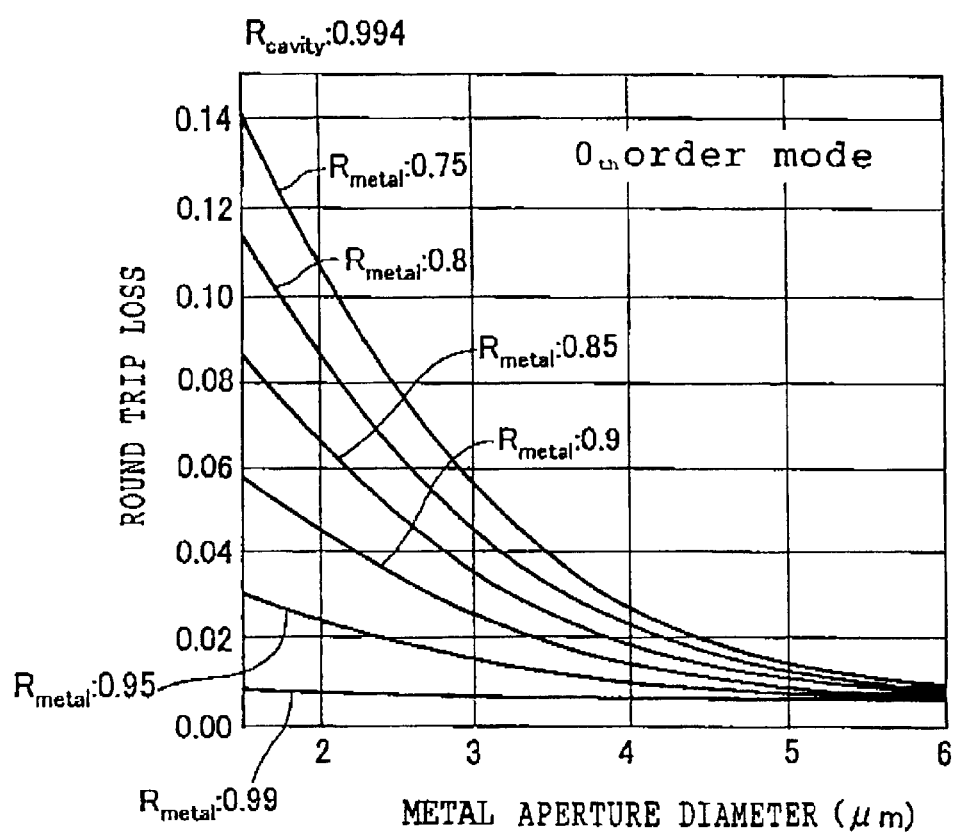
FIG. 2 is a graph showing an metal aperture diameter dependency relating a round trip loss of a cavity in a fundamental lateral mode when an aperture diameter of a current confinement portion is 3.5 µm.
Figure 3:
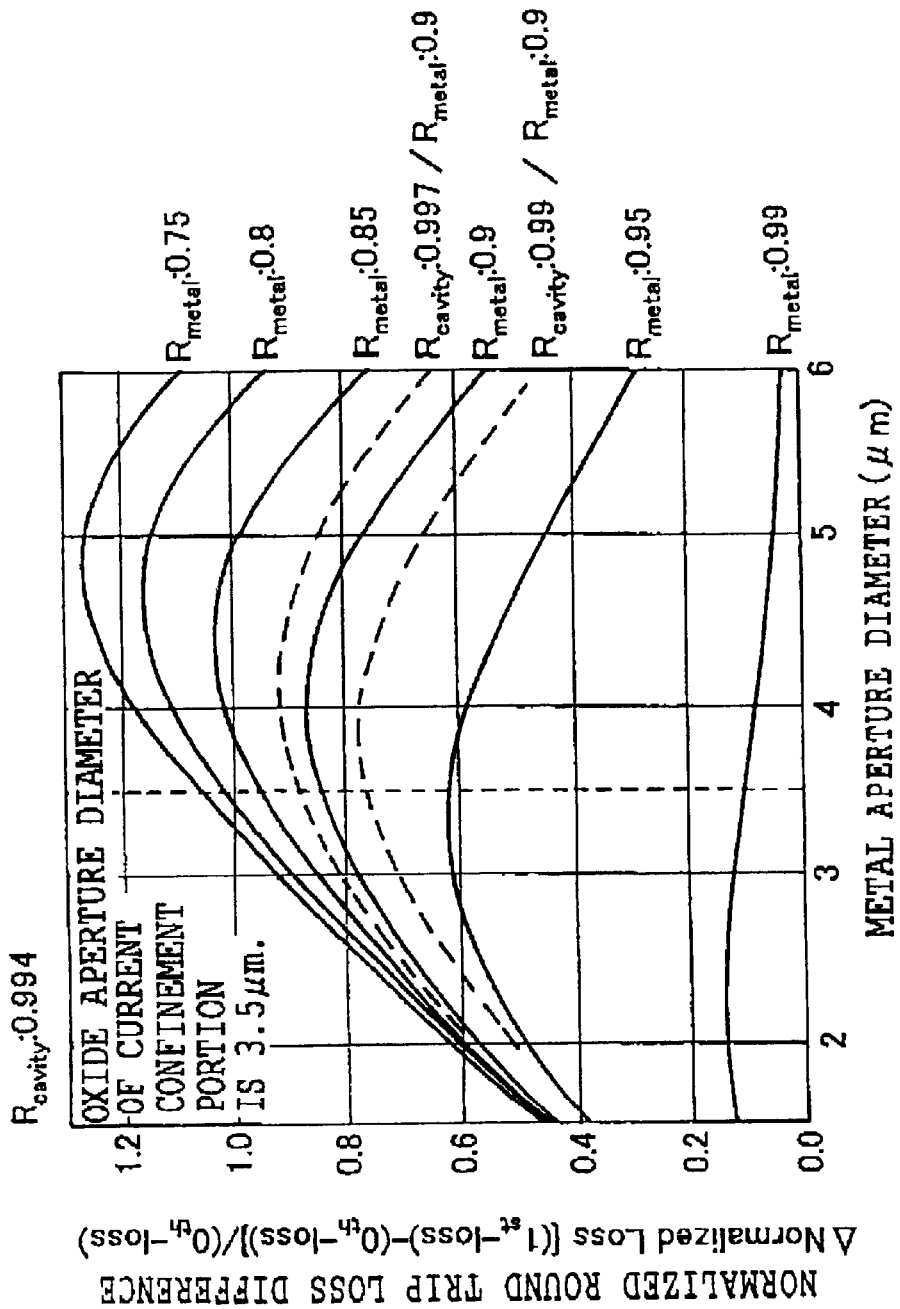
FIG. 3 is a graph showing an metal aperture diameter dependency when a difference between a round trip loss of a cavity in a primary-order lateral mode and a round trip loss of the cavity in the fundamental lateral mode is normalized by the latter, and a reflectance of the cavity in a region corresponding to an upper electrode is taken as a parameter.
Figure 4:
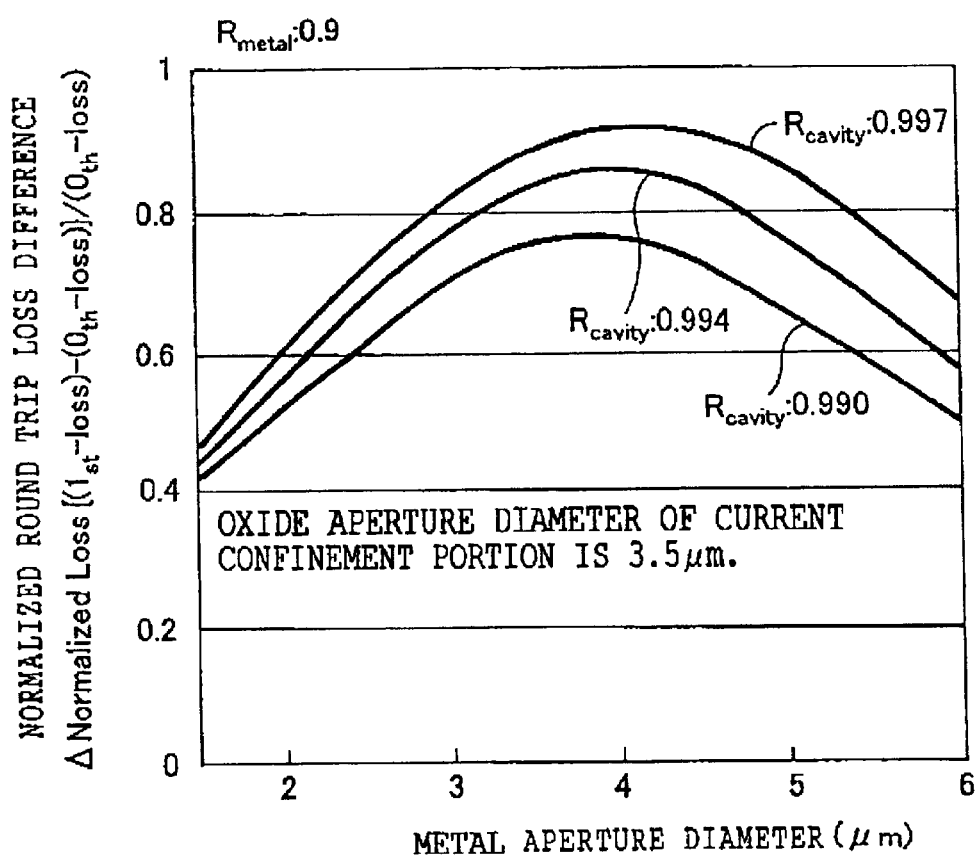
FIG. 4 is a graph showing an metal aperture diameter dependency when a difference between a round trip loss of the cavity in the primary-order lateral mode and a round trip loss of the cavity in the fundamental lateral mode is normalized by the latter, and a reflectance of the cavity in a region corresponding to an emission region is used as a parameter.
Figure 5:
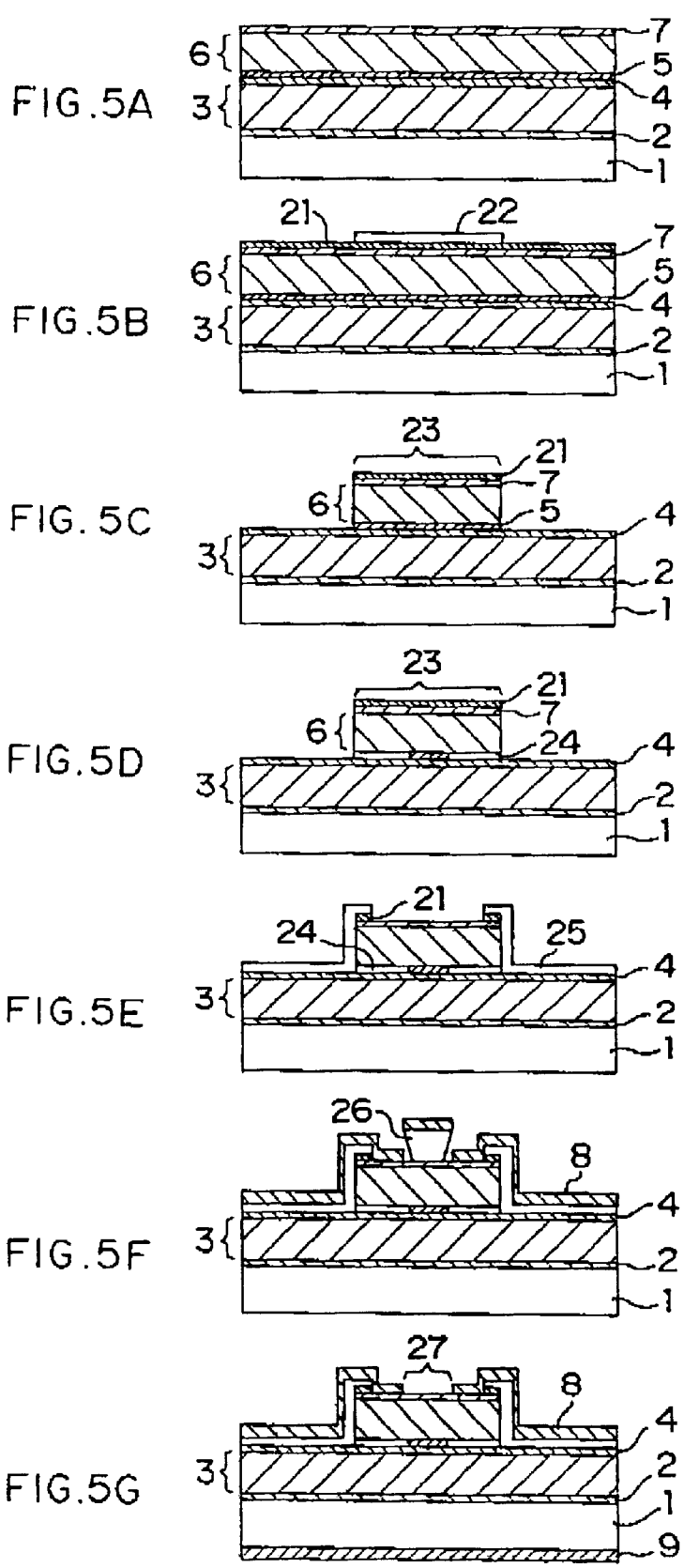
FIGS. 5A to 5G are cross-sectional views sequentially illustrating a manufacturing process of a VCSEL relating to a first embodiment of the present invention.

As illustrated in FIG. 5A, using a metal organic chemical vapor deposition (MOCVD) method, an n-type GaAs buffer layer 2, a lower n-type DBR layer 3, an active region 4, a p-type AlAs layer 5, an upper p-type DBR layer 6, and a p-type GaAs contact layer 7 are sequentially layered on an n-type GaAs substrate 1.

The n-type GaAs buffer layer 2 has a film thickness of 0.2 $\mu$m, and is composed of n-GaAs having a carrier density of $1\times10^{18}$ cm$^{-2}$ after doping Si as an n-type impurity. The n-type GaAs buffer layer 2 fulfills a role of smoothly advancing an epitaxial growth including Al thereafter.

The lower n-type DBR layer 3 is a plural-layer layered product having alternately layered by 40.5 cycles n-type $Al_{0.9}Ga_{0.1}As$ and n-type $Al_{0.3}Ga_{0.7}As$, so that the film thickness of each layer becomes $\lambda/4n_r$ (where $\lambda$ is a laser oscillation wavelength, and $n_x$ is a refractive index of a constituent medium). The lower n-type DBR layer 3 has a carrier density of $3\times10^{18}$ cm$^{-3}$.

The active region 4 is a layered product composed of a quantum well layer of undoped $Al_{0.11}Ga_{0.89}As$ having a film thickness of 9 nm, a barrier layer of undoped $Al_{0.3}GaAs_{0.7}$ having a film thickness of 5 nm, and a spacer layer of undoped $Al_{0.5}GaAs_{0.5}$ between which the quantum well layer and the barrier layer are interposed (film thickness to be described later). The number of quantum well layers is suitably determined based on desired characteristics (oscillation wavelength). In the present embodiment, three quantum layers and four barrier layers are provided, and it is possible to obtain an oscillation wavelength of 780 nm. Regarding the film thickness of the spacer layer, as the spacer layer substantially becomes an optical cavity, the thickness of the active region 4 is set to become an integer times $\lambda/n_r$, and the film thickness of the spacer layer is set such that a loop portion of a standing wave that is assumed to be generated in this region is located at a position corresponding to the quantum well layer.

The p-type AlAs layer 5 is a layer subjected to oxidization processing by steam at a later stage. As the p-type AlAs layer 5 structures a part of the upper p-type DBR layer 6 (lowest layer), the film thickness of the p-type AlAs layer 5 is basically $\lambda/4n_r$. However, in actuality, the material structuring the $\lambda/4n_r$ film does not all have to be AlAs. On the contrary, when the AlAs layer is thick, there is a problem in that the optical dispersion loss increases. Therefore, in the present embodiment, the AlAs layer itself has a film thickness of 20 m, and the remaining portion structuring the $\lambda/4n_r$ film is $Al_{0.9}Ga_{0.1}As$. Further, the carrier density after the doping of Mg that becomes a p-type impurity is $1\times10^{18}$ cm$^{-3}$.

The upper p-type DBR layer 6 is a plural-layer layered product having alternately layered by 29.5 cycles p-type $Al_{0.9}Ga_{0.1}As$ and p-type $Al_{0.3}Ga_{0.7}As$, so that the film thickness of each layer becomes $\lambda/4n_r$. The upper p-type DBR layer 6 has a carrier density of $3\times10^{19}$ cm$^{-3}$. Further, in order to lower series resistance of the element, particularly, in order to lower electrical resistance generated in the multi-layer mirror layer having a p-type conductivity in which the incorporation of impurities is difficult and in which it is difficult to raise the carrier density, there may be provided at the interface between $Al_{0.9}Ga_{0.1}As$ and $Al_{0.3}Ga_{0.7}As$ in the upper p-type DBR layer 6 an intermediate layer having a film thickness of 9 nm whose Al composition ratio changes in stages from 90% to 30%.

The p-type GaAs contact layer 7 has a film thickness of 10 nm, and is composed of p-GaAs having a carrier density of $1\times10^{19}$ cm$^{-3}$ after the doping of Zn which becomes a p-type impurity. The p-type GaAs contact layer 7 fulfills a role of obtaining an ohmic contact at the time of forming an electrode thereafter.

As raw material gases, the following are used. For a crystal growth material, trimethyl gallium, trimethyl aluminum, and arsine are used. For a p-type dopant material, cyclopentadiniello magnesium, and dimethyl zinc are used. For an n-type dopant material, silane is used. The temperature of the substrate at the time of crystal growth is set to 750° C. Crystal growth is carried out continuously by sequentially changing over the raw material gases without breaking the vacuum.

Next, a laser substrate is taken out from a growing chamber. then a SiON film 21 is deposited on the substrate, and thereafter, a resist mask 22 is formed (FIG. 5B). Using this resist mask 22, a reactive ion etching is carried out with $BCl_3$: $Cl_2$ As an etchant, until at least when the AlAs layer 5 is exposed, that is, until when the etching reaches the upper surface of the lower n-type DBR layer 3. Thus, a cylindrical post 23 having a diameter of 30 $\mu$m is formed. Then, the resist mask 22 is removed (FIG. 5C). The etching is carried out to a depth until when the AlAs layer 5 is exposed. Alternatively, the etching may be carried out up to the GaAs substrate 1.

This is stored in an electric furnace that is maintained at a temperature 360° C., and a heat treatment is carried out for forty minutes using a nitrogen gas as a carrier gas (a flow rate: two liters/minute) under a steam atmosphere. Thus, the AlAs layer 5 is selectively oxidized from the periphery of the post. As a result. a high-resistant current confinement portion (an oxidized region) 24 having an aperture with a diameter 3.5 $\mu$m is formed above the active region 4 (FIG. 5D). In this case, a non-oxidized region that remains without being oxidized becomes a current injection region.

Thereafter, a SiN protection film 25 is deposited on the upper surface of the substrate including an exposed post side surface. For taking a contact with an electric wiring, the p-type GaAs contact layer 7 is exposed by removing the SiN protection film 25 and the SiON film 21 in the center region of the top of the post (FIG. 5E).

A construction 26 made of a resist having an overhang shape of a predetermined diameter (3 to 20 $\mu$m) in a circle shape as viewed from above the substrate, is formed in the center region of the top of the post from which the SiN protection film 25 and the SiON film 21 have been removed. On this construction 26, Ti and Au are deposited continuously to form a p-side electrode (upper electrode) 8 by an EB (electron beam) deposition from the above (FIG. 5F). Each metal member has a film thickness of 10 nm for Ti and 30 nm for Au.

Next, the construction 26 made of the resist is removed to carry out what is called a lift off, thereby removing the metal material of the construction 26. On the top of the post, an metal aperture diameter 27 is formed that is defined to within a range of 3 to 20 μm by the diameter of the resist. On the rear surface of the substrate, Au/Au—Ge deposited as an n-side electrode 9. Last, a heat treatment is carried out at an environmental temperature 350° C. for ten minutes under a nitrogen atmosphere. As a result, a VCSEL is completed (FIG. 5G).

Figure 6:
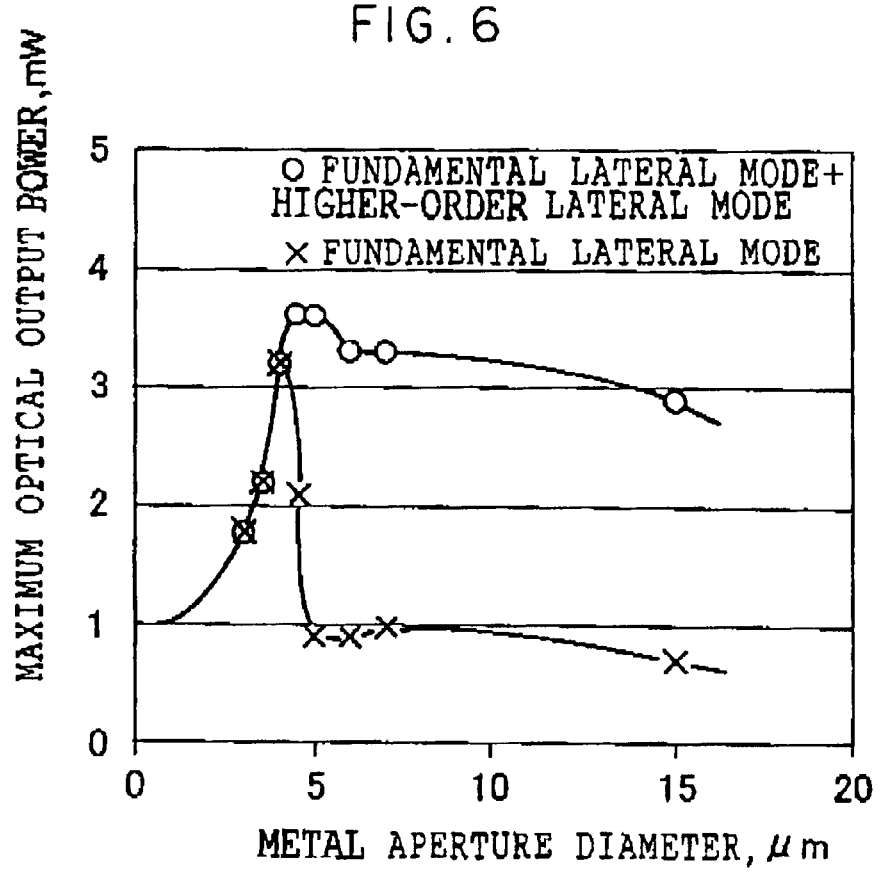
FIG. 6 is a graph showing a relationship between an metal aperture diameter and an optical output power of the surface emitting semiconductor laser relating to the first embodiment of the present invention.
Figure 7:
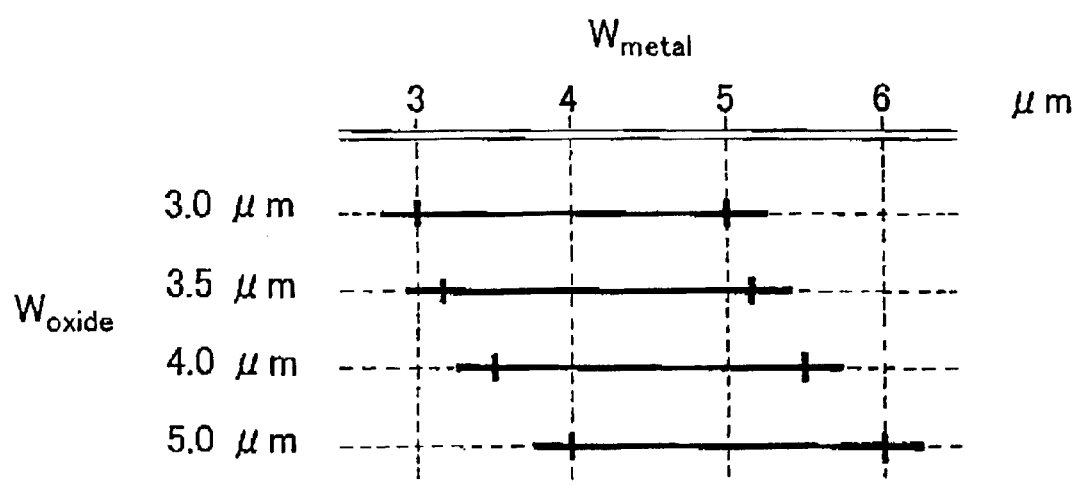
FIG. 7 is a graph showing aperture diameters of a current confinement portion and preferable ranges of an metal aperture diameter.

In the VCSEL manufactured through the above process, the reflectance of a cavity of the region corresponding to the upper electrode is lowered, and the reflectance of the cavity of the region corresponding to an emission region not formed with the upper electrode is maintained at a high level. FIG. 6 shows a relationship between the metal aperture diameter and the optical output power obtained based on an electro-optic evaluation carried out for an element that is in this state. The graph shows a dependency on the metal aperture diameter, of both a fundamental lateral mode optical output power that is defined by a standard that an SMSR (Side Mode Suppression Ratio) of an oscillation spectrum is 20 dB or above, and a net optical output power (including the optical output power in a higher-order lateral mode oscillation) that is obtained without this limit.

As in the present embodiment, when the aperture diameter of the current confinement portion is 3.5 μm, the net optical output power increases monotonously along with the increase in the metal aperture diameter, and is gradually saturated. This means that the net optical output power increases monotonously until when the metal aperture diameter becomes sufficiently large as compared with the aperture diameter of the current confinement portion, and that a part of the optical beam emitted from the active region is shielded and distinguishes (optical loss) when the metal aperture diameter becomes further larger.

On the other hand, the fundamental lateral mode optical output power shows a maximum value when the metal aperture diameter is 4 μm, and the fundamental lateral mode optical output power decreases rapidly when the metal aperture diameter exceeds this value. This means that the oscillation in the higher-order lateral mode is suppressed and the oscillation in the fundamental lateral mode is selected when the metal aperture diameter is near 4 μm. In other words, in the present embodiment, this phenomenon (a space mode filtering effect) functions effectively for obtaining the fundamental lateral mode oscillation when the metal aperture diameter is larger than the aperture diameter of the current confinement portion by 0.5 μm (that is, when the metal aperture diameter is 4 μm.

As explained above, according to the present embodiment, it is possible to remarkably improve the optical output power during the oscillation in the fundamental lateral mode in the refractive index guiding type VCSEL that has such characteristics as a low threshold value, high efficiency and high-speed response.

Second Embodiment

A VSCEL relating to a second embodiment of the present invention will be explained next. In the first embodiment, a description has been made of the behavior of the fundamental lateral mode optical output power when the metal aperture diameter is changed by assuming that the aperture diameter of the current confinement portion is 3.5 μm. In the second embodiment, the dependency of the fundamental lateral mode optical output power on the metal aperture diameter when the aperture diameter of the current confinement portion is changed will be explained. The structure of the laser itself remains unchanged from that of the first embodiment and therefore, the explanation of the laser will be omitted here. Elements having the aperture diameter of the current confinement portion as 3 μm, 4 μm and 5 μm are manufactured by adjusting the heat treatment time for selectively oxidizing the AlAs layer 5.

Figure 8:
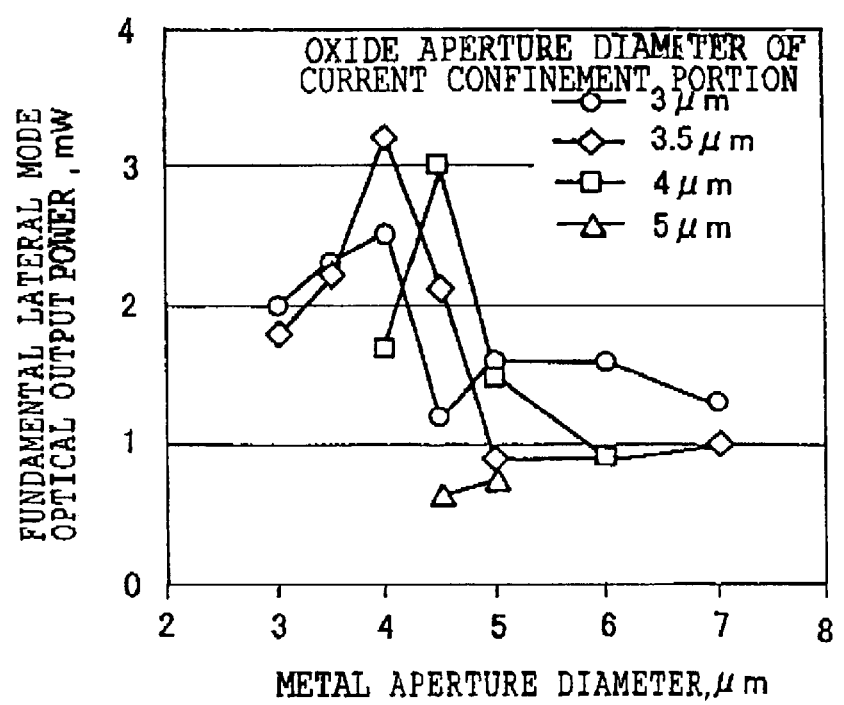
FIG. 8 is a graph showing a relationship between an metal aperture diameter and an optical output power, with an aperture diameter of a current confinement portion taken as a parameter, of a surface emitting semiconductor laser relating to a second embodiment of the present invention.

FIG. 8 shows a result of an electrooptic evaluation carried out, and a relationship between the metal aperture diameter and the optical output power obtained in an similar manner to that of the first embodiment. A graph in FIG. 8 shows a dependency on the metal aperture diameter, with regard to the fundamental lateral mode optical output power defined by a standard that the SMSR of the oscillation spectrum is 20 dB or above (under this definition, a higher-order lateral mode output of a third order or below is permitted). For the sake of comparison, the data of the element having the aperture diameter of the current confinement portion as 3.5 μm obtained in the first embodiment is also plotted. When the aperture diameter of the current confinement portion is 3 μm, the fundamental lateral mode optical output power shows a maximum value when the metal aperture diameter is 4 μm, when the aperture diameter of the current confinement portion is 4 μm, the fundamental lateral mode optical output power shows a maximum value when the metal aperture diameter is 4.5 μm. When the aperture diameter of the current confinement portion is 5 μm, the fundamental lateral mode optical output power shows a maximum value when the metal aperture diameter is 5 μm. When the aperture diameter of the current confinement portion exceeds 5 μm, the fundamental lateral mode optical output power shows a rapid reduction when the metal aperture diameter exceeds 4 μm. However, an absolute value when the fundamental lateral mode optical output power shows a maximum value is highest when the aperture diameter of the current confinement portion is 3.5 μm. Then, the absolute value is high when the aperture diameter of the current confinement portion is 4 μm, 3 μm, and 5 μm, in this order. From the above result, it can be understood that there exists an optimum value for the metal aperture diameter which makes it possible to effectively function to obtain a fundamental lateral mode oscillation, like in the case where the aperture diameter of the current confinement portion is 3.5 μm. This value changes according to the aperture diameter of the current confinement portion. When the aperture diameter of the current confinement portion is within the range from 3.0 to 5.0 μm, it is preferable that the metal aperture diameter takes a value larger than the aperture diameter of the current confinement portion by 0 to 1 μm. As the aperture diameter of the current confinement portion becomes larger, it is preferable that there is a small difference between the metal aperture diameter and the aperture diameter of the current confinement portion.

On the other hand, it has been known that the lateral mode characteristics of the selective oxidization type VCSEL for forming the current confinement portion by thermally oxidizing a part of the distribution reflection layer from he edge, strongly depend on the aperture diameter (inner diameter) of the current confinement portion. Particularly, when the diameter is 5 μm or lower (under these conditions, a higher-order lateral mode output of a low order of 3 or below is permissible), it is possible to obtain fundamental lateral mode oscillation. This is because the current confinement portion (the oxidized region) that has a lower refractive index than that of the surrounding semiconductor material is concerned with the shielding of the optical beam as well as the shielding of the current. When the diameter becomes much smaller, the higher-order mode oscillation is not permitted, and only the fundamental lateral mode oscillation is shown. This value is estimated as 3 μm or below, according to references. When the diameter is further larger than this, the current injection and the higher-order mode oscillation are generated even when the fundamental lateral mode oscillation is obtained, near the oscillation threshold value. Thus, the oscillation output in the fundamental lateral mode is limited. Therefore, the improvement in the fundamental lateral mode optical output power is necessary when the aperture diameter of current confinement portion is 3 μm or above. It is possible to suitably select the aperture diameter of current confinement portion within the range from 3 μm to 20 μm.

Based on the results obtained from the first embodiment and the second embodiment, it can be understood as follows. It is possible to suppress the higher-order lateral mode oscillation and to selectively obtain the fundamental lateral mode oscillation in the VCSEL, when a relationship between the metal aperture diameter and the aperture diameter of the current confinement portion is determined such that the normalized round trip loss difference is set as large as possible according to a difference or ratio between the reflectance of cavity of the region corresponding to the upper electrode and the reflectance of the cavity of the region corresponding to the emission region. Further, when the relationship between the metal aperture diameter and the aperture diameter of the current confinement portion is determined such that the normalized round trip loss difference is set as large as possible, the metal aperture diameter can be limited to within a predetermined range. Further, there is observed such a trend that the laser beam irradiation angle becomes smaller than that of the conventional VCSEL that has a sufficiently larger metal aperture diameter than the aperture diameter of the current confinement portion. As a result, it is possible to increase the combination efficiency when making a direct combination with an optical fiber.

Figure 22:
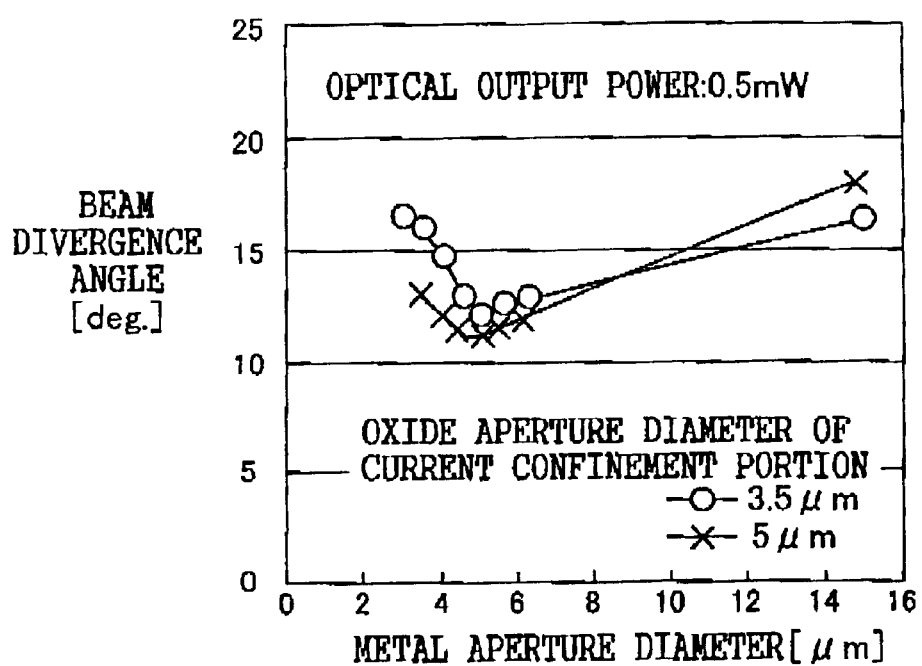
FIG. 22 is a graph showing a relationship between a metal aperture diameter and a beam divergence angle when a current confinement portion has aperture diameters of 3.5 $\mu$m and 5 $\mu$m.

When a beam divergence angle of an element having aperture diameters of the electrode and the current confinement portion which have been defined by the above-described method was measured, it was noted that characteristic features which depends on both of the metal aperture diameter (electrode aperture diameter) and the aperture diameter of the current confinement portion can be obtained. FIG. 22 shows a graph when the metal aperture diameter is plotted in abscissa, and the beam divergence angle is plotted in ordinate, and a case in which, as parameters, aperture diameters of the current confinement portion are 3.5 μm and 5 μm.

In either case, it can be seen that the beam divergence angle has a minimum point with respect to the metal aperture diameter. Further, a beam divergence angle in a conventional VCSEL having an electrode whose aperture diameter is sufficiently larger than that of a current confinement portion (which corresponds to a case in which the metal aperture diameter is 15 μm) has increased by 3 to 6 degrees from the minimum point.

In an element whose aperture diameter of the current confinement portion is 5 μm, when the metal aperture diameter is 5 μm, a maximum fundamental lateral mode optical output power value was obtained, and a beam divergence angle was minimum, on the other hand, in an element whose aperture diameter of the current confinement portion is 3.5 μm, when the metal aperture diameter is 4 μm, a maximum fundamental lateral mode optical output power was obtained, and the beam divergence angle was smaller than that when the metal aperture diameter was less than 4 μm, and did not reach the minimum value. However, within a range of 4 to 6 μm, the beam divergence angle were lower than that when the metal aperture diameter is 15 μm, thus providing an effect of reducing the beam divergence angle The reason the sizes (degree) of the beam divergence angle reverse when the aperture diameter of the current confinement portion is between 3.5 and 5 μm and the metal aperture diameter is 15 μm is thought to be due to the fact that the element whose aperture diameter is 3.5 μm maintains a fundamental lateral mode oscillation in spite of the metal aperture diameter, whereas the element whose aperture diameter is 5 μm is in a higher-order mode.

Third Embodiment

A VCSEL pertaining to a third embodiment of the present invention will be described. In the first and second embodiments, examples have been given in which, by using two kinds of electrode materials. Ti and Au, administering an EB deposition at a film thickness of 10 nm for Ti and 30 nm for Au, and thereafter performing a heat treatment at an environmental temperature of 350° C. for ten minutes, the upper electrode is formed and the reflectance of the cavity of the region corresponding to the upper electrode is lowered. With the exception of conditions for forming the upper electrode, the present embodiment is similar to the first embodiment, and because the structure of the laser itself is the same as that described in this first and second embodiments, description thereof will be omitted.

Methods for lowering the reflectance of a cavity by providing the upper electrode include, for example, the following two methods.

Figure 10:
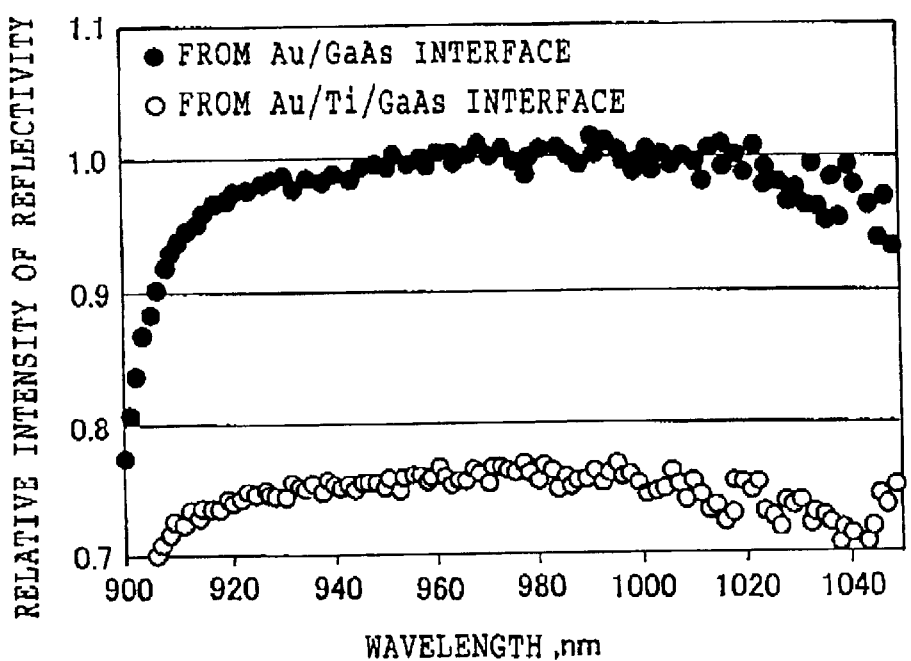
FIG. 10 is a graph showing changes in reflection intensity of a white-color beam in an Au/GaAs interface and an Au/Ti/GaAs interface.

(1) A method in which the upper electrode is formed by layering two or more kinds of metal materials. FIG. 10 shows a result of measuring a relative intensity of reflectivity in a predetermined wavelength region by making a white-color light incident onto an Au/GaAs interface and an Au/Ti/GaAs interface respectively from a GaAs substrate side, based on a preparation of a sample of Au deposited on a GaAs substrate and a sample of Au/Ti desposited on a GaAs substrate. According to FIG. 10, it can be understood that the relative intensity of reflectivity is substantially lowered when the metal film is structured by two or more metal materials by inserting Ti into Au/GaAs interface, as compared with the case of not inserting Ti into the Au/GaAs interface. Prom this, it has been verified by experiments that it is possible to control the relative intensity of reflectivity of a metal/GaAs interface according to the kinds of metal films layered on the substrate. Conventionally, Au has often been used for forming an ohmic electrode on a contact layer of a semiconductor laser element. However, it is possible to substantially lower the reflectance of the cavity of the region corresponding to the upper electrode by forming an electrode with a plurality of metal materials by inserting a further separate metal material into the Au/GaAs interface.

The electrode material is not particularly limited, and it is possible to select a material from among a wide range of materials. Among others, it is preferable that a material is selected from Au, Pt, Ti, Zn, Ni, In, W, Cu, Al, Au—Sn alloy, Au—Zn alloy, Au—Ge alloy, and ITO (indium tim oxide). For example, it is possible to laminate Pt in addition to Ti, or to use Cr, Au—Sn, Au—Zn, Au—Ge, Au—Ge/Ni, ITO, etc., in place of Ti. However, because of the needs for carrying out wiring for a current injection, it is preferable that Au that can be easily combined by melting with an Au wire is a metal wire at a far side from the active region. Further, the depositing is not limited to the EB deposition. It is also possible to use a resistance heating method, a sputtering method, a magnetron sputtering method, a CVD method, etc. Further, the film thickness of each metal material of the upper electrode is not particularly limited. The film thickness of an outermost layer may be within a range from 100 nm to 1000 nm, and the film thickness of other layers may be within a range from 1 nm to 100 nm.

Figure 11:
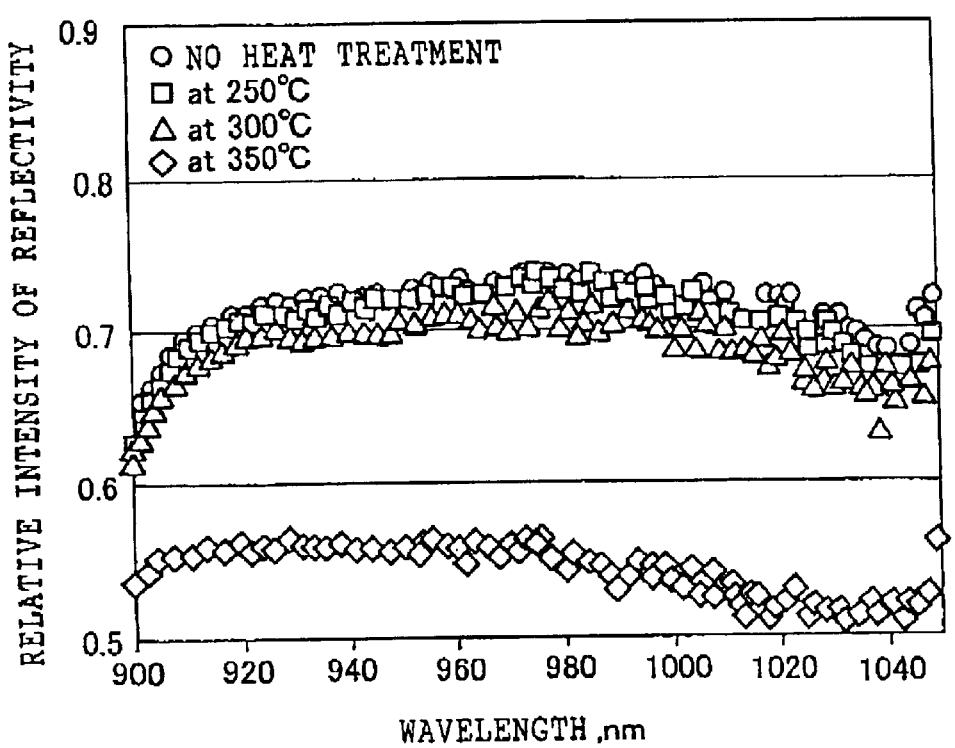
FIG. 11 is a graph showing changes in reflection intensity of a white-color beam at the Au/Ti/GaAs interface.
Figure 12:
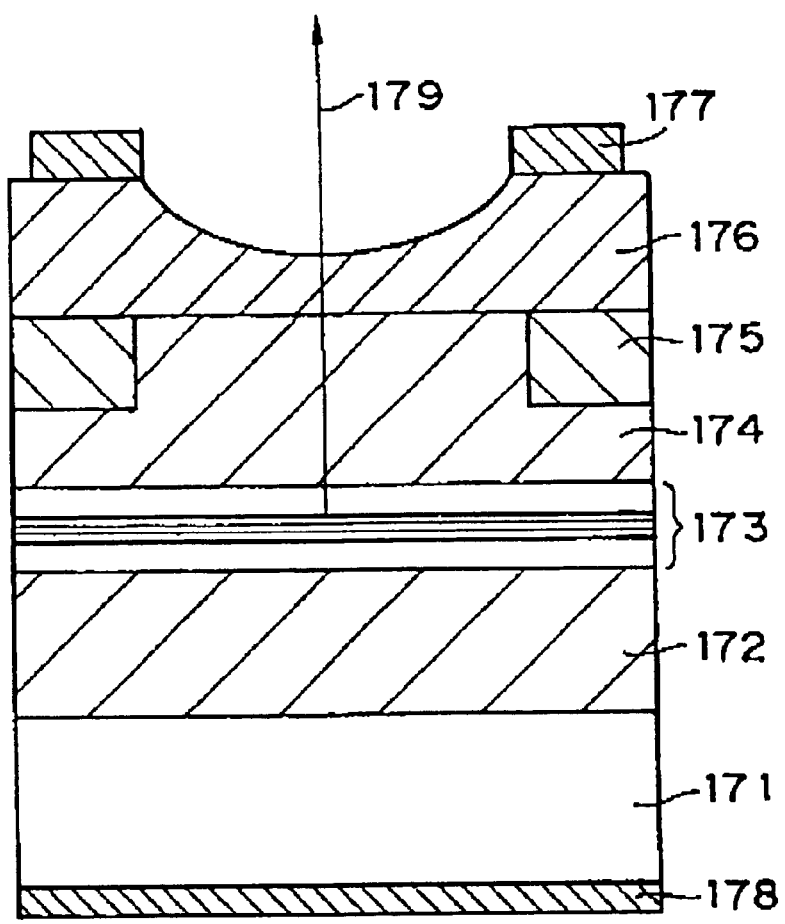
FIG. 12 is a cross-sectional view of a conventional VCSEL.
Figure 13A:
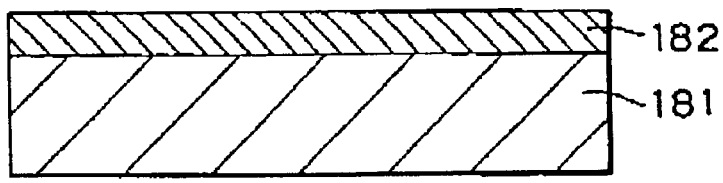
FIGS. 13A to 13D are cross-sectional views sequentially illustrating a manufacturing process of a convex loss determination element of a conventional VCSEL.
Figure 13B:
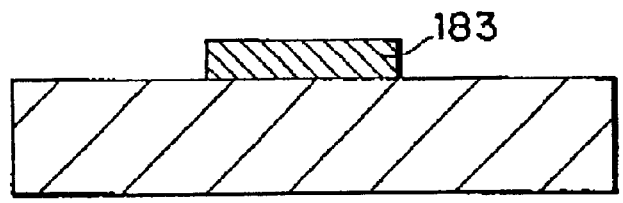
Figure 13C:
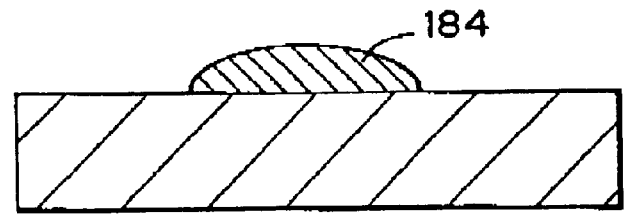
Figure 13D:
Figure 14:
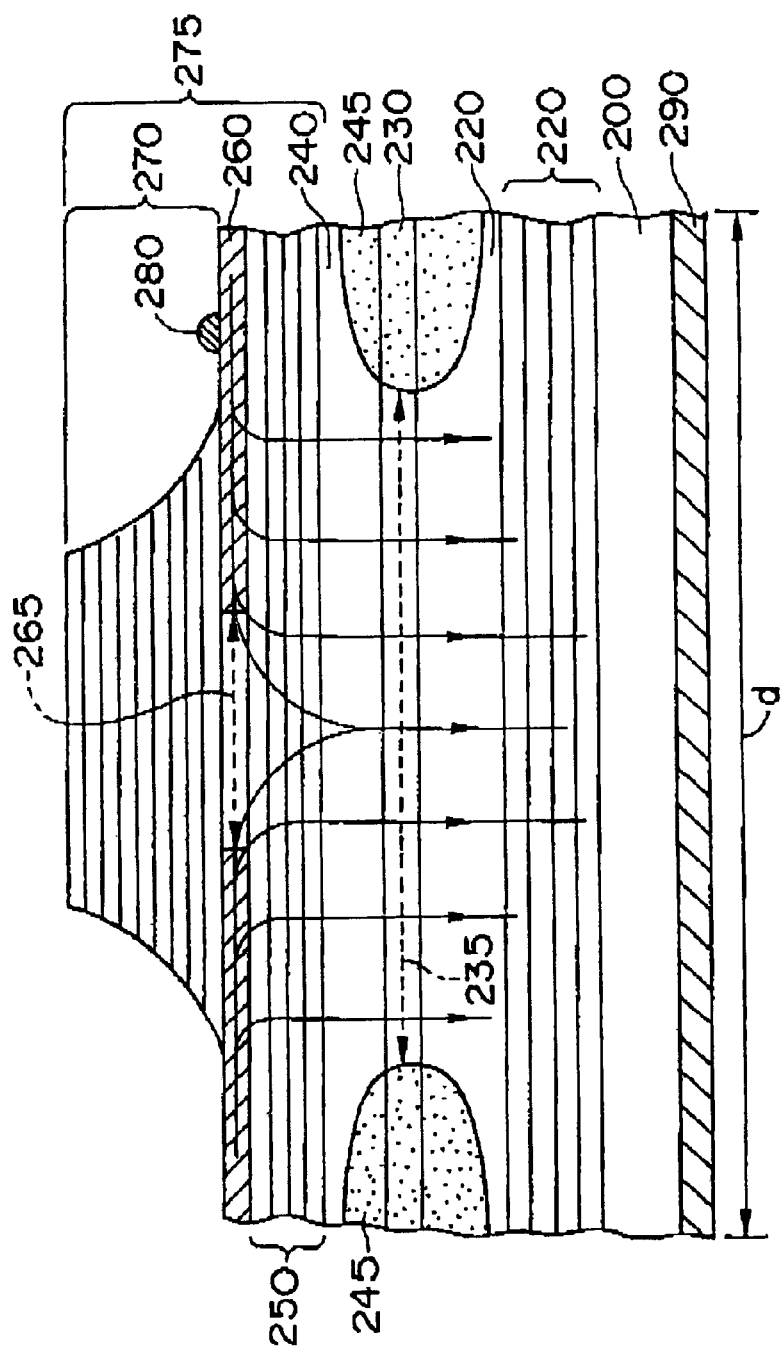
FIG. 14 is a cross-sectional view of a conventional surface emitting semiconductor laser.
Figure 15:
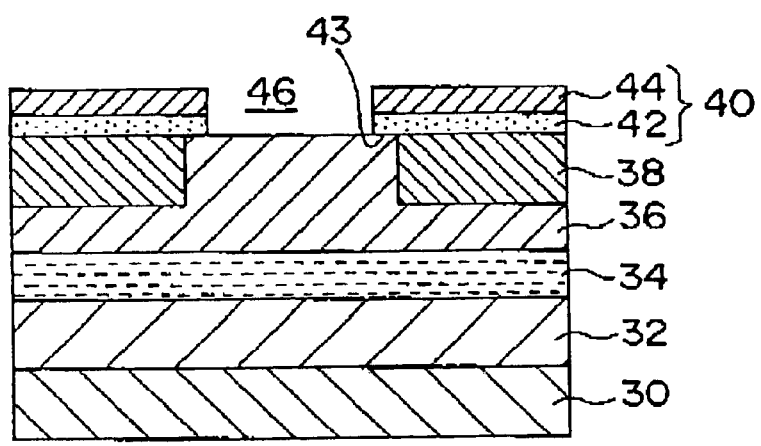
FIG. 15 is a cross-sectional view of a conventional surface emitting semiconductor laser.

(2) A method in which the upper electrode is formed by forming a thin film made of a metal material, heat treating the thin film within a temperature range of 250° C. to 400° C., and then advancing the alloying between the thin film and a layer adjacent to the thin film. FIG. 11 shows a result of measuring a relative intensity of reflectivity by making a white-color light incident onto an Au/Ti/Gas interface from a GaAs substrate side, based on a sample prepared by depositing Au/Ti on a GaAs substrate and then heat-treating the result at an environmental temperature within a temperature range from 250° C. to 350° C. under a nitrogen atmosphere, and a sample not heat-treated. According to FIG. 11, it can be understood that the relative intensity of reflectivity is lowered according to the environmental temperature, as compared with the case of not heat-treating. From this, it has been verified by experiments that it is possible to control the relative intensity of reflectivity of a metal/GaAs interface by carrying out a hear treatment at a suitable temperature after depositing Au/Ti. Conventionally, a heat treatment has often been carried out for forming an ohmic electrode on a contact layer of a semiconductor laser element. However, it is possible to substantially lower the reflectance of the cavity of the region corresponding to the upper electrode as compared with the region corresponding to the emission region, by selecting a suitable atmosphere and an environmental temperature.

The environmental temperature for the heat treatment is suitably selected from a range of 250° C. to 400° C. at which the electrode is not hardened by a ball-up attributable to the heat treatment at a high temperature. It is preferable that the heat treatment is carried out at the environmental temperature within a temperature range from 300° C. to 350° C. The heat treatment time is not particularly limited, and can be suitably selected from within a range of time at which a desired effect can be obtained. According to the experiments, the effect can be obtained when the heat treatment is carried out for a short period of time of a few dozens of seconds. On the other hand, when the heat treatment is carried out over a long period of time like 30 minutes or one hour, there is no particular increase in the effect. As a heat treatment method, it is possible to use flash lamp annealing by infrared rays, laser annealing, high-frequency heating, annealing by an electronic beam, and lamp heating.

In the first, second and third embodiments described above, the shape of the upper electrode aperture is substantially round, However, the shape of the upper electrode aperture formed on the p-type contact layer may be formed in a two-axis symmetrical shape having a long axis in one optional direction.

Figure 9:
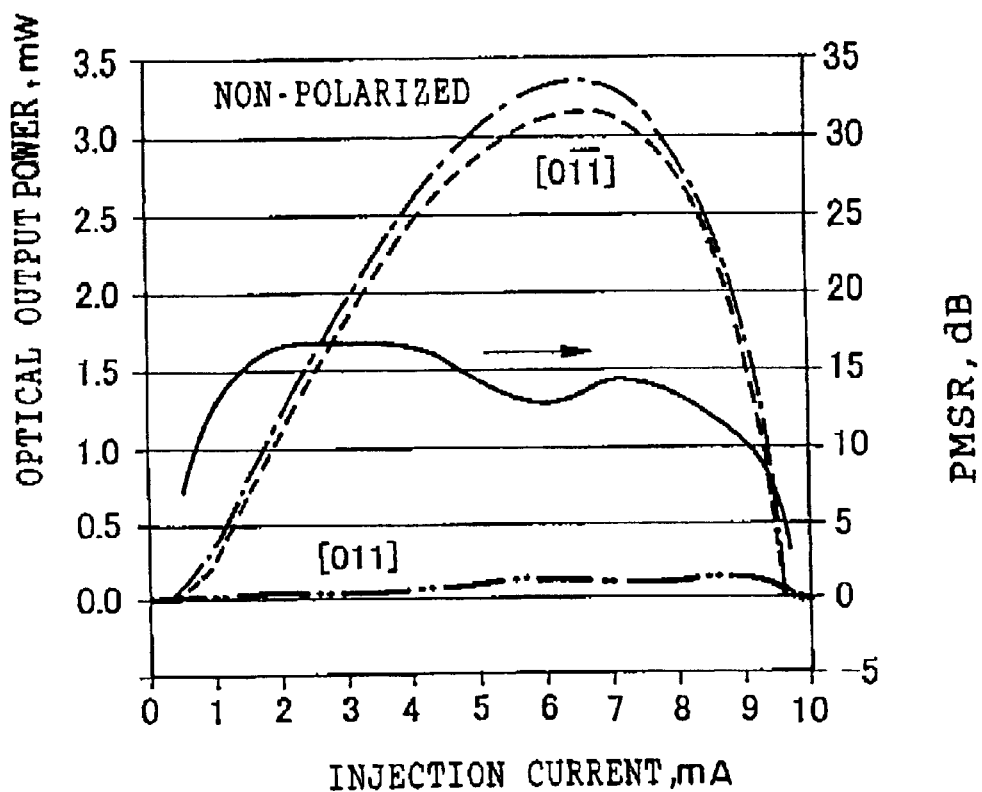
FIG. 9 is a graph showing a relationship between an injection current amount and a polarized optical output power, and a polarization mode suppression ratio of a surface emitting semiconductor laser relating to a third embodiment of the present invention.

FIG. 9 is an optical output power-injection current characteristic of a laser beam emitted from a emission aperture that has been evaluated with a photodetector after the laser beam has been passed through a Glan-Thompson prism. The Glan-Thompson prism functions as a polarizer. Therefore, it is possible to detect only an output beam having a polarized component in a specific direction by rotating the Glan-Thompson prism within a plane perpendicular to a light progressing direction. The evaluation is carried out by setting the rotation angle in two directions of an angle at which the optical output power becomes maximum and an angle at which the optical output power becomes minimum when the injection current volume is constant at 2 mA (a portion which shows an optical output power 0.5 mW when the laser beam has not been passed through the Glan-Thompson prism). In general, the VCSEL shows linear polarization characteristics. Therefore, these two directions are orthogonal with each other. In FIG. 9, there is also shown a PMSR (Polarization Mode Suppression Ratio) that expresses an optical output power ratio of these two directions, by a solid line.

It can be understood that the PMSR exceeds 10 dB when the injection current volume is 7 mA at which the optical output power becomes maximum, and thus the polarization direction is controlled. A [01-1] direction that is a polarization direction shown by the VCSEL corresponds to the long axis direction of the shape of the aperture of the upper electrode. It can be considered that there arises a diffraction loss near the emission aperture in the two axial directions, and the polarization component in the long axis direction in which the diffraction loss ratio is relatively small has been selected. Thus, it is easy to control the polarization characteristics, and it is possible to use the laser together with the optical parts that are easily influenced by the polarization characteristics.

It should be noted that it is also possible to similarly control the polarization characteristics when the aperture of the current confinement portion (the oxidized region) is formed in a two-axis symmetrical shape having a long axis in one optional direction.

In the first, second and third embodiments above, description has been made of examples of the VCSEL having a cylindrical post provided, with the electrode aperture also formed in a circular shape. It is also possible to obtain a similar effect when the post has a prism shape and the electrode aperture has a circular shape. The current confinement portion formed based on the prism post has a square shape in many cases, and the light emission region also has a square shape corresponding to the shape of the region into which the carrier is injected. However, the lateral mode shape for a laser oscillation obtained by a Hermitian-Gaussian mode approximation makes little difference when the shape of the current confinement portion is circular or square. From this, the shape of the post is not a substantial problem in the effect of the present invention. The aperture diameter of the current confinement portion can be estimated to correspond to the diameter of a circle or the size of a side of a square.

In the first, second and third embodiments above, description has been made of a case where the AlAs layer to be subjected to a selective oxidization is inserted into an anti-node portion of a standing wave pattern within the cavity in order to obtain a low threshold value by optical confinement by an oxidized layer at a position of a high optical intensity. The present invention can also be applied to an element of a structure that the insertion position of the AlAs layer is shifted to a node portion of the standing wave patter in order to increase the controllability of the lateral mode by weakening the optical confinement. However, depending on the degree of optical confinement, there is a potential that a numerical relationship (an optimum value) between the metal aperture diameter at which the fundamental lateral mode oscillation is selected most efficiently and the aperture diameter of the current confinement portion changes. Specifically, assume that when the aperture diameter of the current confinement portion is 3.5 μm, the optimum value of the metal aperture diameter is 4.0 μm when the AlAs layer has been inserted into a node portion of the standing wave pattern within the cavity. Then, in this case, it is estimated that the optimum value of the metal aperture diameter shifts by 4.5 to 5.5 μm when the insertion position of the AlAs layer has actually been shifted to the node portion of the standing wave pattern. However, this is within the range of a design matter, and this dose not refuse the probability of the invention.

In the first, second and third embodiments above, the lower electrode is set to the n-type and the upper electrode is set to the p-type. However, it is also possible to set the lower electrode to the p-type and set the upper electrode to the n-type. It is possible to exhibit the effect of the present invention regardless of the setting of the n-type or the p-type each electrode.

In the first, second and third embodiments above, description has been made of the case where AlGaAs is used for the active region. However, it is also possible to apply the invention to a near infrared VCSEL using GaAs or InGaAs or to a red-color VCSEL using InGaP or AlGaInP. Further, it is of course also possible to utilize the invention for blue-color or ultraviolet VCSEL of a GaN system or ZnSe system, or for a 1.3 μm to 1.5 μm band VCSEL of an InGaAsP system or the like.

Figure 16:
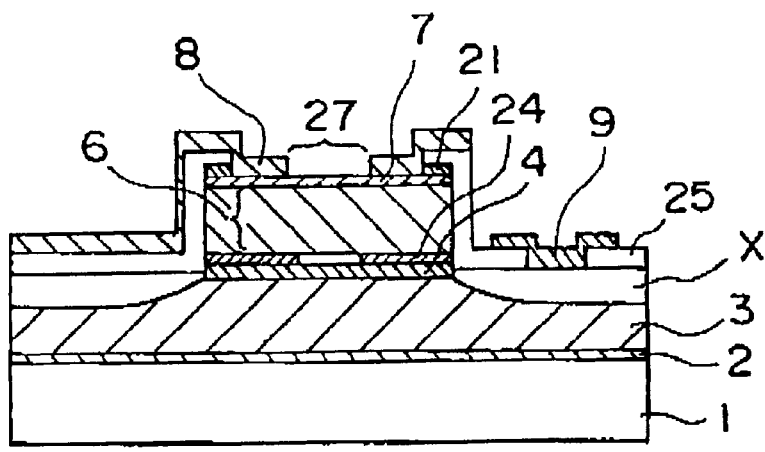
FIG. 16 is a cross-sectional view of another structure of a surface emitting semiconductor laser according to the present invention.

In the first, second and third embodiments, examples of forming the n-side electrode at a lower portion of the substrate have been explained. However, it is also possible to form the n-side electrode at the upper portion of the substrate. For example, as shown in FIG. 16, it is possible to form an n-type impurity diffused region X by diffusing an n-type impurity from the upper surface of a lower n-type DBR layer 3 that has been exposed at the time of forming a cylindrical post 23, and to form an n-side electrode 9 on this n-type impurity diffused region X. In FIG. 16, constituent portions of the VCSEL identical to those of the VCSEL in the first embodiment are attached with like reference symbols, and their explanation will be omitted.

In this case, a current injected from a p-side electrode 8 flows through an active region 4 in a lateral direction, and reaches the n-side electrode 9. Based on the provision of the p-side electrode 8 and the n-side electrode 9 at one side of the substrate as explained above, it becomes easy to carry out wiring at the time of integrating the VCSEL with a driving circuit and others. Further, as the lower n-type DBR layer 3 dose not form a current path, it is possible to structure the lower n-type DBR layer 3 using an intrinsic semiconductor.

Fourth Embodiment

With reference to FIG. 17, a description of a surface emitting semiconductor laser of a fourth embodiment of the present invention will be made hereinafter.

By using a Metal-organic Chemical Vapor Deposition (MOCVD) method, on (100) surface of an n-type GaAs substrate 51 (see FIG. 17A) are layered a lower multi-layer reflecting film 52 comprising a stacked body of n-type $Al_{0.9}Ga_{0.1}As$ layers and n-type $Al_{0.3}Ga_{0.7}As$ layers; a lower spacer layer 53 comprising an undoped $Al_{0.5}Ga_{0.5}As$ layer; a quantum well active layer 54 comprising a stacked body of quantum well layers made of an undoped $Al_{0.11}Ga_{0.89}As$ layer and barrier layers made of an undoped $Al_{0.3}Ga_{0.7}As$ layer; an upper spacer layer 55 comprising an undoped $Al_{0.5}Ga_{0.5}As$ layer; a p-type AlAs layer 56; an upper multi-layer reflecting film 57 comprising p-type $Al_{0.9}Ga_{0.1}As$ layers and p-type $Al_{0.3}Ga_{0.7}As$ layers; and a contact layer 58 comprising a p-type GaAs layer in this order.

The lower multi-layer reflecting film 52 comprises a stacked body of a plurality of layers including n-type $Al_{0.9}Ga_{0.1}As$ layers and n-type $Al_{0.3}Ga_{0.7}As$ layers. However, a thickness of each layer is $\lambda/4 \, n_r$ (however, $\lambda$ is an oscillation wavelength and $n_r$ is a refractive index of a medium), and AlGaAs layers having different mixed crystal ratios are alternately stacked in 40.5 periods. The carrier density of this film involving silicon used as an n-type impurity is $2 \times 10^{18}$ cm$^{-3}$.

The upper multi-layer reflecting film 57 comprises a stacked body of a plurality of layers comprising p-type $Al_{0.9}Ga_{0.1}As$ layers and p-type $Al_{0.3}Ga_{0.7}As$ layers. However, a thickness of each layer is $\lambda/4 \, n_r$, and AlGaAs Layers having different mixed crystal ratios are alternately stacked in 23.5 periods. An AlAs layer 56 is provided under the lower layer of the upper multi-layer reflecting film 57. The AlAs layer 56 and layers each having a thickness of $\lambda/4 \, n_r$ are stacked so that the total periods of stacking is 24 to thereby structure the upper multi-layer reflecting film. As to the AlAs layer 56, all of the materials for structuring $\lambda/4 \, n_r$ layer are not necessarily formed by AlAs. Rather, there is a problem in that the thicker the AlAs layer, the more the optical scattering loss. Therefore, in this embodiment, the AlAs layer is formed in a thickness of 20 nm and the remainder of the AlAs layer is formed by $Al_{0.9}Ga_{0.1}As$. The carrier density of this film involving carbon which is a p type impurity is $3 \times 10^{18}$ cm$^{-3}$.

The number of layers of the upper multi-layer reflecting film 57 are less than those of the lower multi-layer reflecting film 52 in order to take emitted light from the top of the substrate by differentiating reflectances. Though a detailed description is not given, for a purpose of decreasing serial resistances of the element, in the upper multi-layer reflecting film 57, an AlGaAs intermediate layer having an intermediate mixed crystal ratio is provided between the $Al_{0.11}Ga_{0.89}As$ layer and the $Al_{0.3}Ga_{0.7}As$ layer.

The quantum well active layer 54 is a triple quantum well structure in which three sets in which a quantum well layer including an undoped $Al_{0.11}Ga_{0.89}As$ layer having a thickness of 8 nm and a barrier layer including an undoped $Al_{0.3}Ga_{0.7}As$ layer having a thickness of 5 nm are stacked alternately. However, since an outermost layer is a barrier layer in order to prevent a carrier from overflowing from the quantum well layer, the number of the barrier layers is four. As a result, a laser oscillation with a wavelength of 780 nm can be obtained.

A total thickness between the bottom of the lower spacer layer 53 and the top of the upper spacer layer 55 is an integral multiple of $\lambda/n_r$. A so-called "peak" (anti-node) portion of standing wave (having the highest intensity) is formed between the bottom of the lower spacer layer 53 and the top of the upper spacer layer 55 and designed so as to be located at the quantum well active layer 54. A contact layer 58 comprising a p-type GaAs layer has a thin layer with a thickness of 20 nm. However, a carrier density of this layer involving zinc which is a p-type impurity is $1 \times 10^{20}$ cm$^{-3}$.

After a laser substrate has been taken from a reactor and SiON 71 to be used as a masking material during etching was deposited on the substrate, a circular resist mask 72 is formed (see FIG. 17B), and exposed portions of the SiON 71 are removed by a buffered hydrofluoric acid (BHF). The remaining portion of the SiON 71 is used as an etching mask to etch the layers on the substrate until at least the AlAs layer 56 is exposed due to a reactive ion etching using $BCl_3:Cl_2$ as a gas source, whereby a cylindrical post 73 whose diameter is 30 μm is formed (see FIG. 17C).

Etching may end to the depth of the lower multi-layer reflecting film 53 or to that of the GaAs substrate 51, and the depth is not directly related with the content of the present invention.

Since the configuration of a post may change in accordance with that of the resist mask 72, for example, a square resist mask 72 can be formed and then a prismatic post 73 having a square cross-sectional configuration when viewed from the top can be formed.

In this way, after at least the upper multi-layer reflecting film 57 was formed in a mesa (post) shape, the substrate with the layers was exposed to an atmosphere of moisture at 360° C. for 40 minutes by using nitrogen as a carrier gas (flow rate: 2L/min.). During this process, the AlAs layer 56 for forming a portion of the upper multi-layer reflecting film is noticeably likely to be oxidized as compared to the $Al_{0.9}Ga_{0.1}As$ layer and the $Al_{0.3}Ga_{0.7}As$ layer, oxidation develops from the outer peripheral portion to the post interior of the layer.

At this point, an insulating region (current confinement portion) 74 is formed at a portion of the interior of the post, i.e., a portion directly above the active region. A non-oxidized portion 75 that has been remained unoxidized is used as a current injecting region (see FIG. 17D). The non-oxidized portion 75 is formed in a circular configuration whose diameter is 4 μm by reflecting the post configuration. However, in a case of the square post, the non-oxidized portion 75 is formed into a square configuration, or, when oxidation anisotropy is generated, a rectangular configuration. In the following description, terms such as an aperture of the current confinement portion 74 or the non-oxidized region 75 are used. However, they are substantially equal.

Figure 17A:
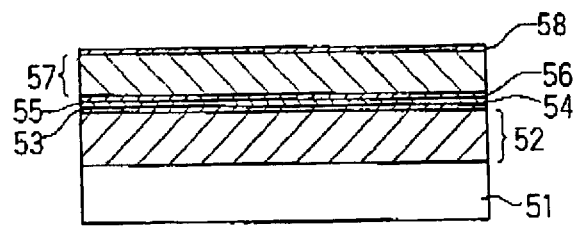
FIGS. 17A to 17G are cross-sectional views in a manufacturing process of a surface emitting semiconductor laser having a geometrical metal aperture according to a fourth embodiment of the present invention.
Figure 17B:
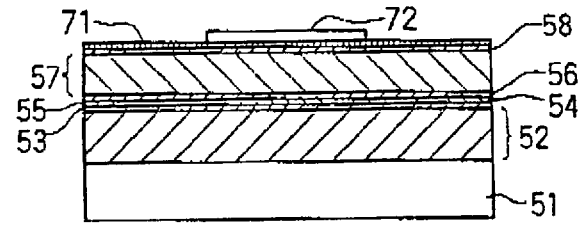
Figure 17C:
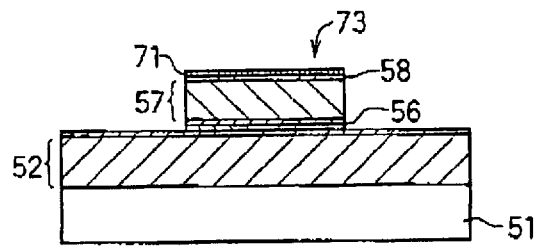
Figure 17D:
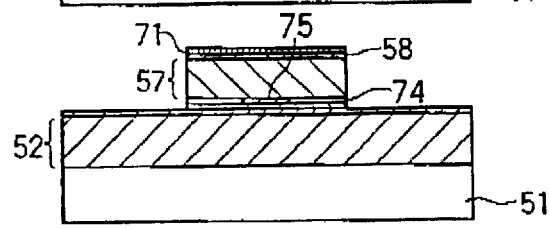
Figure 17E:
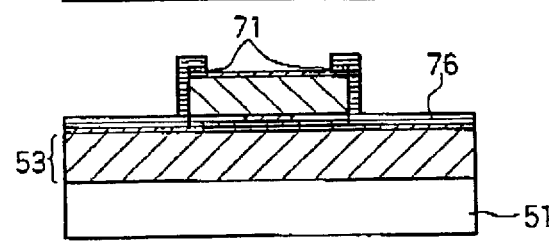
Figure 17F:
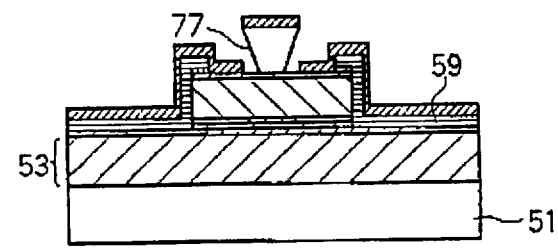

Thereafter, SiN 76 as a protective film is deposited on the substrate, covering post sides. However, the SiN 76 is removed by etching at a portion of the top of the post in order for an outer device to be in electrical contact with the element, while the SiON 71 that has been used as an etching mask during the forming of the post is also removed (FIG. 17E).

At the central region of the top of the post, a resist (structure) 77 is formed into a flat oval configuration having short and long axes (3 μm×5 μm), when viewed from the top of the substrate. However, forming conditions of this resist are appropriately selected so that the resist is formed into an overhang configuration for afterwards conducting an electrode lift-off process. Further, the long axial direction chose the (01-1) direction as a crystal orientation.

The structure 77 can be formed into a planar configuration that is geometrically two-fold symmetrical configuration (which returns to its original shape when rotated at 180°), such as an ellipse, a rectangle or a rhomboid, other than the flat oval configuration.

Ti and Au for structuring a p-side electrode 59 are sequentially deposited from the top by electron-beam evaporation (see FIG. 17F) and film thicknesses thereof are respectively 10 nm and 30 nm.

Figure 17G:
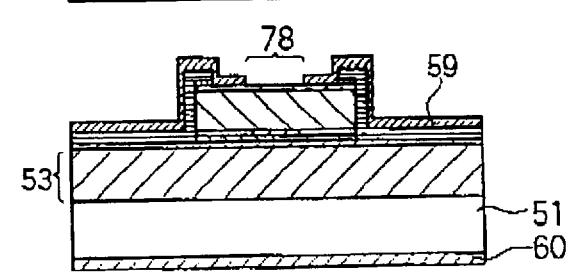

During the removal of this resist (structure 77), a so-called "lift-off" is conducted to remove a metal material from the resist. A flat oval metal aperture 78 which is defined by a diameter of the resist is formed at the top of the post Further, an n-side electrode 60 comprising Au—Ge/Ni/Au is formed at the back side of the substrate. Finally, a heat treatment is conducted for 10 minutes at an environmental temperature of 350° C. in an atmosphere of nitrogen. As a result, the surface emitting semiconductor laser according to the present invention is completed (FIG. 17G).

Figure 18A:
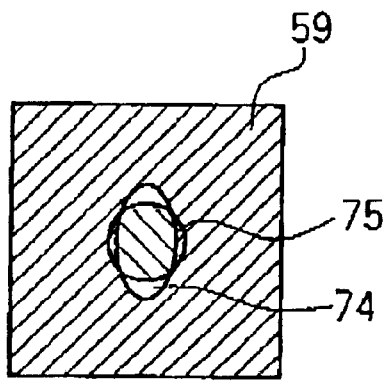
FIG. 18A is a top view of the surface emitting semiconductor laser having the geometrical metal aperture according to the fourth embodiment of the present invention.

FIG. 18A shows a structure of the element according to the present embodiment when viewed from the top A flat oval metal aperture is formed so as to overlap with a portion of a circular non-oxidized region when viewed form the top.

FIG. 9 shows optical output power-injection current (polarization L-I) characteristics in which a laser beam emitted in the upper direction of the substrate is detected by a photo-detector through a Glan Thompson prism and measured. The Glan Thompson prism functions as a polarizer and is able to detect only emitted light having a polarized component in a specified direction by rotating the prism within a plane perpendicular to a light progressing direction. Here, evaluation was carried out by setting two rotational angles in two directions in which, in a specified amount of injected current, the optical output power becomes maximum and the optical output power becomes minimum. The two directions are respectively the [01-1] direction and the [011] direction in the element of the present invention. Since the surface emitting semiconductor laser generally exhibits linear polarization characteristics, these two directions intersect to one another. An OPSR (Orthogonal Polarization Suppression Ratio) which expresses a ratio of optical output power intensity in two directions is also illustrated in the graph.

It can be seen that, even when a flow rate of the injected current is 7 mA at which the optical output power becomes maximum, the OPSR exceeds 10 dB, and the polarization direction is sufficiently controlled. The [01-1] direction which is the polarization direction oriented by the laser element of the present invention corresponds to a long axial direction of the aperture formed in the upper electrode, while the [011] direction in which the optical output power becomes minimum (or 0) corresponds to the short axial direction. This can be considered because different diffraction losses occur in vicinities of emitting apertures in two axial directions, whereby long axial directional polarized components having relatively lower diffraction loss are selected.

Fifth Embodiment

A description of a surface emitting semiconductor laser according to a fifth embodiment of the present invention will be made next.

In the fourth embodiment of the present invention, the aperture formed in the upper electrode is formed into the two-fold symmetrical configuration having the long and short axes in the arbitrary two axial directions. However, in the present embodiment, the aperture of a current confinement portion (oxidized region) is formed into a two-fold symmetrical configuration having long and short axes in arbitrary two axial directions. Since a vertical (stacking) structure of the laser is the same as that in the fourth embodiment of the present invention, a description thereof will be omitted.

A laser substrate is taken from a reactor, and the SiON 71 as the masking material during etching is deposited over the substrate. Thereafter, a resist mask 72 which is formed into a flat oval configuration when viewed from the top, having a short axis and a long axis which are 30 μm and 31 μm, respectively, is formed, and then, the exposed portions of the SiON 71 are removed by BHF. The remaining portion of the SiON 71 is used as an etching mask to etch the layers on the substrate until at least the AlAs layer 56 is exposed due to the reactive ion etching in which $BCl_3:Cl_2$ is used as a gas source, whereby a post 73, the short and the long axes of which are 30 μm and 31 μm, is formed. The post 73 is formed into a flat oval configuration when viewed from the top. At this point, the long axial direction is Bet so as to correspond to the [01-1] direction as a crystal orientation.

Since a configuration of the post may change in accordance with that of the resist mask 72, the resist mask 72 having a geometrically two-fold symmetrical planar configuration (which returns to its original shape when rotated at 180°) such as an ellipse, a rectangle or a rhomboid can be formed, and then the post 73 whose cross-sectional configuration has a long axis and a short axis when viewed from the top can be formed.

Thereafter, when a heat oxidation process has been finished, the configuration of the non-oxidized region 75 is affected by that of the post 73 and is a flat oval configuration having short and long axes which are 3 μm and 4 μm, respectively.

Figure 18B:
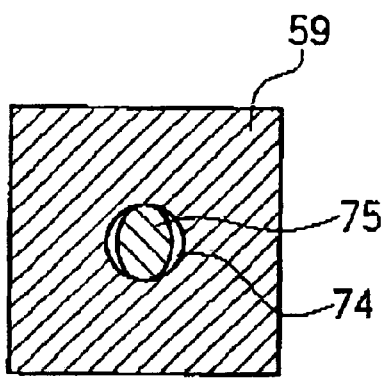
FIG. 18B is a top view of a surface emitting semiconductor laser having a geometrical post configuration according to a fifth embodiment of the present invention.

A circular resist structure 77 whose diameter is 4 μm is formed at the central region of the top of the post. Thereafter, Ti and Au are sequentially deposited on the upper layer and the resist 77 by an electron-beam evaporation. When a metal material is lifted-off from the resist, a circular metal aperture portion 78 defined by the diameter of the resist is formed on the top of the post. FIG. 18B shows a top view of a structure of the element of the present invention. A circular metal aperture, which is slightly larger than the flat oval non-oxidized region, is formed so as to surround the same.

Figure 19A:
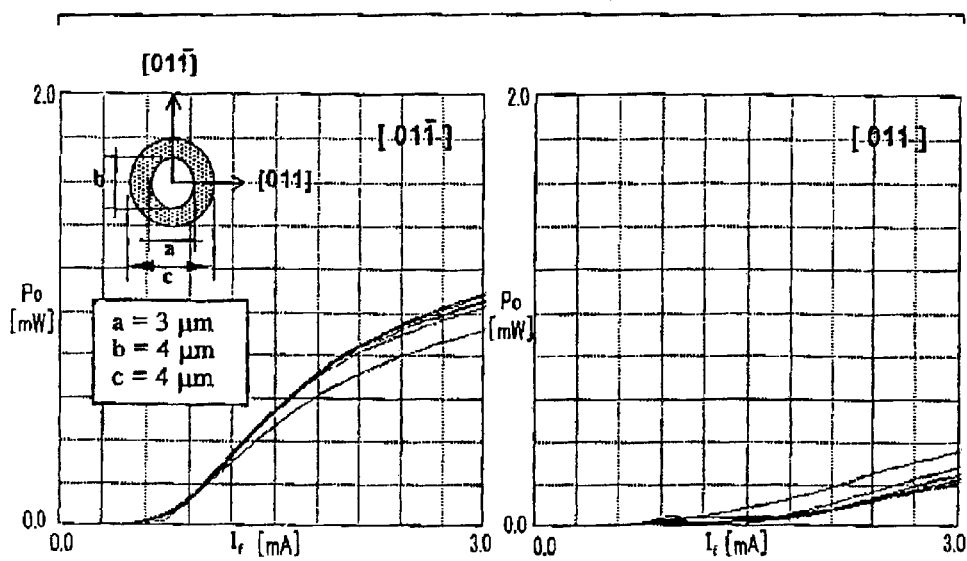
FIGS. 19A and 19B are graphs showing polarization L-I characteristics in the surface emitting semiconductor laser having the geometrical post configuration according to the fifth embodiment of the present invention.
Figure 19B:
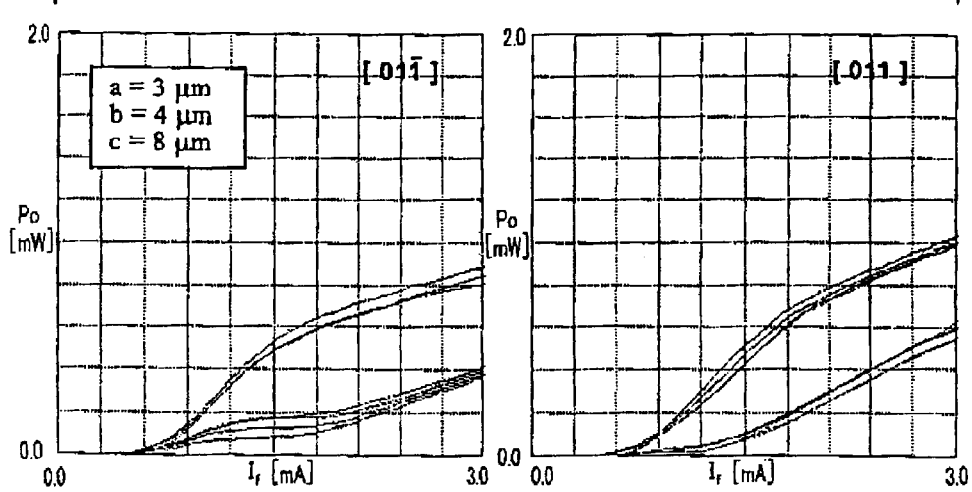

In the same manner as the fourth embodiment of the present invention, FIG. 19 shows polarization L-I characteristics of the element of the present invention. For comparison, results from the element in which the diameter of the metal aperture 78 is 8 μm is also shown. From FIG. 19, in the element in which the metal aperture diameter is 8 μm that is twice as long as the aperture diameter (3×4 μm) of the non-oxidized aperture portion 75, the polarization characteristics become irregular. On the other hand, it can be seen that, when the post is formed in the element in which the metal aperture 78 has a diameter of 4 μm, the polarization direction corresponds to the [01-1] direction as a long axial direction, and the components orthogonal to the polarization direction are suppressed to be low.

In the element with the metal aperture 78 diameter of 8 μm, as a result of a mode competition in accordance with multimode oscillation, it is considered that superimposed different polarized components that are different for each mode are observed. However, in the element with the metal aperture 78 diameter of 4 μm, the higher-order mode suppressing effects which are obtained by the metal apertures, as described in the first and second embodiments of the present invention, functions such that oscillation due to the fundamental mode becomes dominant. Therefore, it can be considered that polarized components mainly incurred from this mode appear. resulting in improvements on polarization characteristics. Here, the structure (resist) 77 can be formed in a square configuration other than a circular configuration.

Figure 20A:
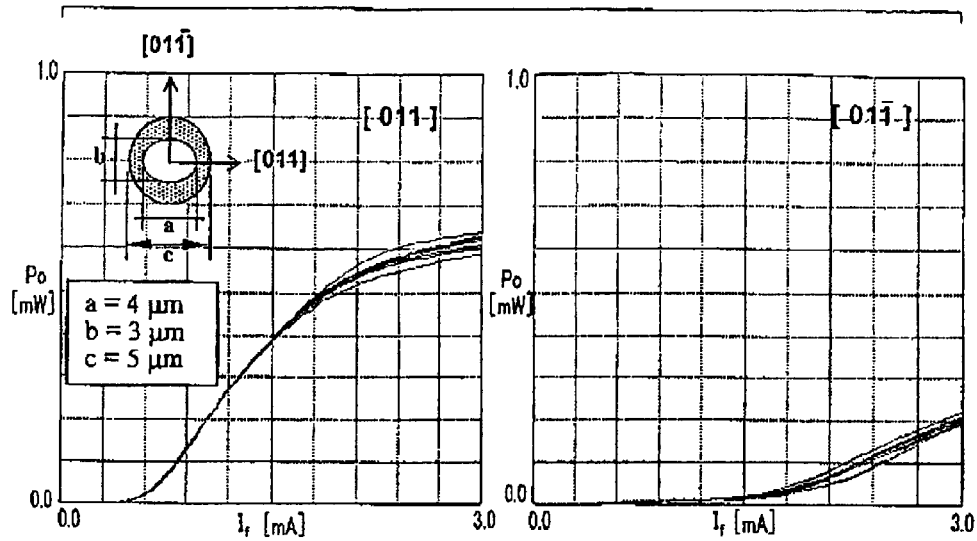
FIGS. 20A and 20B are graphs showing polarization L-I characteristics in another parameter of the surface emitting semiconductor laser having the geometrical post configuration according to the fifth embodiment of the present invention.
Figure 20B:
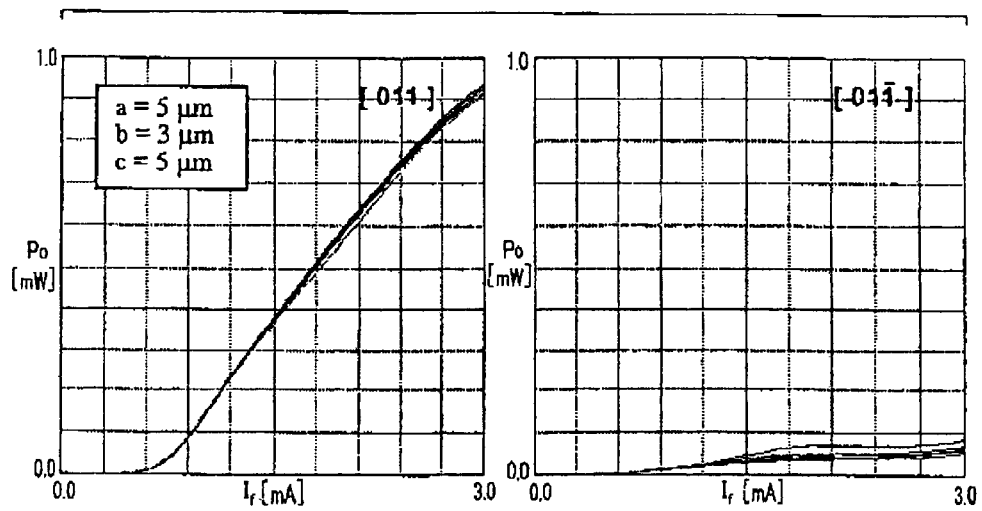

In addition, FIG. 20 shows polarization L-I characteristics if the size (the short axis×the long axis) of the non-oxidized portion is changed to 4×3 μm or 5×3 μm and the diameter of the metal aperture 78 is 4 μm or 5 μm. In this example, the long axial direction is set so as to correspond to the [011] direction. In either case, effects of small diameters of the metal aperture portions (typically, about ±1 μm with respect to the axes of the non-oxidized region) are confirmed, and variation of the polarization characteristics was improved by using metal aperture portions which are equal to or slightly greater than the axes of the non-oxidized region. When the diameter of the metal aperture is sufficiently larger than the axes of the non-oxidized region (typically, the metal aperture portion is larger than the long axis of the non-oxidized region by +3 μm or more), in the same manner as in FIG. 19B, irregularities due to multimode oscillation occurred on polarization characteristics (description of results was omitted).

Figure 21A:
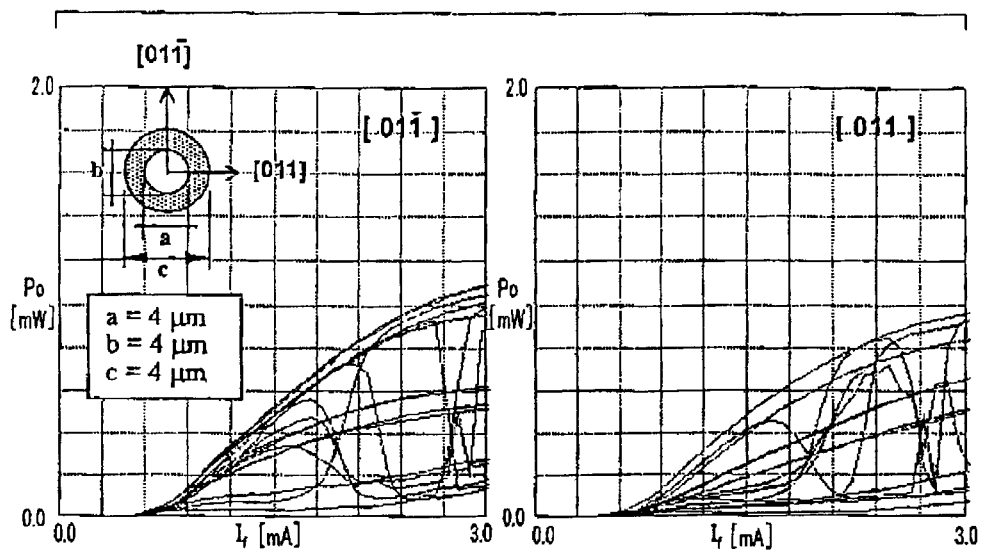
FIGS. 21A and 21B are graphs showing polarization L-I characteristics in another parameter conducted for the comparison of the surface emitting semiconductor laser having the geometrical post configuration according to the fifth embodiment of the present invention.
Figure 21B:
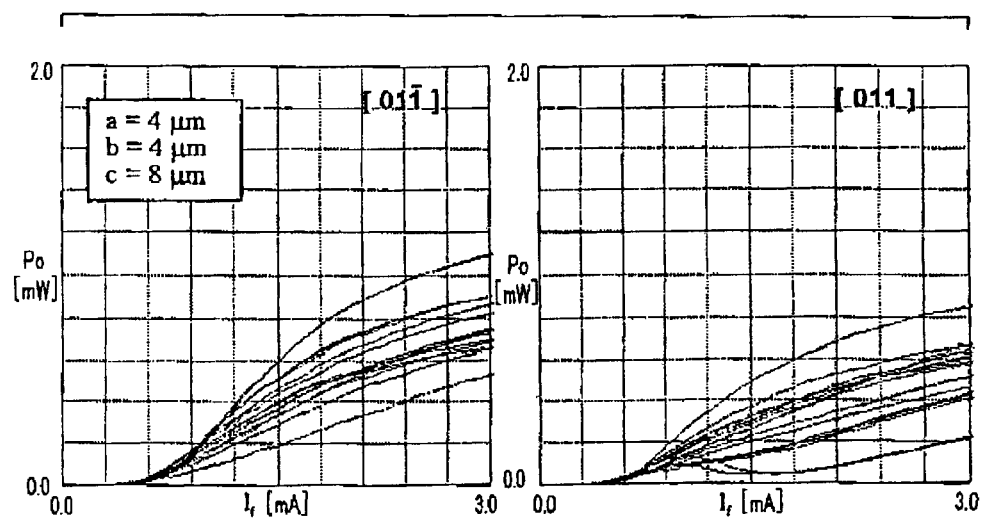

When the non-oxidized region is formed in a symmetrical cross-sectional configuration, even if effects of higher-order mode suppression were shown, there is a case in which switching of orthogonal modes is observed in the polarization characteristics, whereby controllability deteriorates as compared to a case in which the non-oxidized region is formed in a two-fold symmetrical cross-sectional configuration. FIG. 21 shows the polarization L-I characteristics if the diameter of the non-oxidized region is 4 μmφ and diameters of the metal aperture portions 78 are respectively 4 μm and 8 μm. In another oscillating spectrum measurement, it was confirmed that the element in which the diameter of the metal aperture portion 78 is 4 μm oscillates in the fundamental mode within a range of outputs shown in FIG. 21. In the polarization characteristics, there is a case in which some of them corresponds to each other. However, it was observed that polarizations between orthogonal modes were switched in many elements, and it was understood that the situation is different from that in which long and short axes were introduced in the configuration of the non-oxidized region. In the element in which the metal aperture portion 78 has a diameter of 8 μm, irregularities of the polarization characteristics were produced immediately after oscillation because the lateral mode is not controlled.

By this, it can be considered that synergism of the following two matters contributed to the improvements of polarization controllability. The two matters are such that, since the short and long axes are used for the configuration of the non-oxidized region, polarization characteristics between the orthogonal modes become different from one another so that the long axial directional polarization mode became dominant, and since a metal aperture which was effective to control the lateral mode was used, polarized components due to the higher-order mode have been suppressed.

During the heat oxidation treatment, the non-oxidized region 75 is not necessarily formed into a flat oval shape. Whether the non-oxidized region 75 maybe formed in an ellipse or a rhomboid shape depends on how a crystal orientation is set with respect to the orientation of the substrate surface in directions of short and long axes of the post. However, in accordance with experiments of the inventors, it is important that the non-oxidized region 75 is formed into a two-fold symmetrical configuration having long and short axes with respect to two orthogonal arbitrary axial directions within the plane of the substrate. If these conditions are sufficed, polarization controllabilities can be maintained.

In the fourth and fifth embodiments of the present invention, a description of the important condition for controlling polarization has been made in which an aperture portion formed in the upper electrodes or that formed in the current confinement portion is formed into a two-fold symmetrical configuration having long and short axes with respect to two orthogonal arbitrary axial directions within the plane of the substrate. However, it was experimentally verified that two axial directions can exhibit more effects when the crystal orientation of the semiconductor substrate is (100) surface, and [01-1] and [011] directions are combined or directions which are crystallically equal to the [01-1] and [011] directions are combined as the two arbitrary axial directions, which can be said that is a more preferable embodiment.

In the above five embodiments of the present invention, as a material for structuring the quantum well active layer, the GaAs/AlGaAs semiconductor was used. However, the present invention is not limited to this. For example, it is possible to use a GaAs/InGaAs semiconductor or a GaAs/GaInNAs semiconductor for the quantum well active layer.

In the above-described four embodiments of the present invention, the AlAs layer was used as the layer to be oxidized. Regarding $Al_xGa_{1-x}As$ material, the larger the value of x in the AlAs composition ratio, the higher the oxidation rate. Accordingly, the larger the value x, the shorter the time taken for the manufacturing process. Further, it is known that even a small difference between the composition ratios makes a large difference between the oxidation rates. More specifically, it was proved that there is about 3 to 5 times difference between x=1.0 and x=0.98. As a result, a material for the layer to be oxidized is not limited to the AlAs layer in which x=1.0, and the value x can appropriately be selected according to the purpose of an experiment.

Any of the above-described embodiments ought not to be limitedly comprehended, and can be implemented by various methods within a range for sufficing requirements for constituting the present invention.

According to the present invention, a refractive index guiding type surface emitting semiconductor laser that can be easily manufactured and that is capable of oscillating a high-output fundamental lateral mode light is provided. Consequently, a refractive index guiding type surface emitting semiconductor laser that is capable of oscillating a high-output fundamental lateral mode light may be manufactured at a low cost. Further, the surface emitting semiconductor laser may be utilized for a printer apparatus, an optical magnetic disk device and the like, and even for purposes that require a high-intensity fundamental lateral mode optical output power.

In the above embodiments, description has been given of the excitation of the active layer due to current injection from the upper electrode. However, rather than the Upper electrode, a similar structure in which a metal aperture forming an aperture made of metal materials may be used, so that the active layer may also be excited by injecting a layer having an energy greater than the energy band gap of the active layer from the aperture for the purpose of lowering reflectance.

What is claimed is:

1. A surface emitting semiconductor laser, comprising:
    a semiconductor substrate having sequentially layered thereon a lower multi-layer mirror, an active layer region, and an upper multi-layer mirror that, together with the lower multi-layer mirror, contributes to the formation of a cavity;
    an upper electrode disposed on an upper layer of the upper multi-layer mirror and provided with an aperture that forms an emission region of a laser beam generated at the active layer region; and
    a current confinement portion disposed between the upper electrode and the lower multi-layer mirror and provided with an aperture that forms a current path,
    wherein an aperture diameter of the upper electrode and an aperture diameter of the current confinement portion are determined such that a difference between an optical loss of the cavity in a higher-order lateral mode of the laser beam and an optical loss of the cavity in a fundamental lateral mode of the laser beam becomes a value in the vicinity of a maximum value, and the higher-order lateral mode is suppressed, and at least one of the aperture formed in the upper electrode and the aperture of the current confinement portion is formed into a two-fold symmetrical configuration having long and short axes with respect to arbitrary two axial directions orthogonal to each other in a plane.

2. The laser of claim 1, wherein the aperture diameter of the upper electrode is determined at a value that suppresses a higher-order lateral mode, and the aperture diameter of the current confinement portion is determined at a value that permits a higher-order lateral mode of a third order or lower.

3. The laser of claim 1, wherein, when the aperture diameter of the upper electrode is to be made larger than the aperture diameter of the current confinement portion, the aperture diameter of the upper electrode is made larger with in a range of about 2 $\mu$m or lower, and when the aperture diameter of the upper electrode is to be made smaller than the aperture diameter of the current confinement portion, the aperture diameter of the upper electrode is made smaller within a range of about 1 $\mu$m or lower.

4. The laser of claim 1, wherein the aperture diameter of the current confinement portion is about 3 to about 5 $\mu$m.

5. The laser of claim 1, wherein the current confinement portion is formed by insulating a periphery of a current path through oxidization and airgap by etching.

6. The laser of claim 1, wherein the other of the aperture formed in the upper electrode and the aperture of the current confinement portion is formed into an isotropic configuration with respect to the arbitrary two axial directions orthogonal to each other in the plane.

7. The laser of claim 1, wherein, if the crystal orientation of the semiconductor substrate is (100) surface, the arbitrary two axial directions are a combination of [01-1] direction and [011] direction or a combination of directions that are crystallographically isotropic to the combination of the [01-1] direction and the [011] direction.

8. The laser of claim 1, wherein the two-fold symmetrical configuration having the long and short axes is formed into a flat oval, ellipse, rectangular or rhombus shape.

9. The laser of claim 6, wherein the isotropic configuration is formed into a circular, square or regular polygon shape.

* * * * *